United States Patent
Fulford et al.

(10) Patent No.: US 12,507,431 B2
(45) Date of Patent: Dec. 23, 2025

(54) 3D ISOLATION OF A SEGMENTATED 3D NANOSHEET CHANNEL REGION

(71) Applicant: Tokyo Electron Limited, Tokyo (JP)

(72) Inventors: H. Jim Fulford, Albany, NY (US); Mark I. Gardner, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 577 days.

(21) Appl. No.: 17/975,332

(22) Filed: Oct. 27, 2022

(65) Prior Publication Data

US 2024/0145595 A1    May 2, 2024

(51) Int. Cl.
| | |
|---|---|
| *H01L 29/78* | (2006.01) |
| *H10D 30/62* | (2025.01) |
| *H10D 62/10* | (2025.01) |
| *H10D 64/68* | (2025.01) |

(52) U.S. Cl.
CPC ........... *H10D 30/62* (2025.01); *H10D 62/118* (2025.01); *H10D 64/691* (2025.01)

(58) Field of Classification Search
CPC ..... H10D 30/62; H10D 64/691; H10D 62/118
See application file for complete search history.

(56) References Cited

U.S. PATENT DOCUMENTS

| | | | |
|---|---|---|---|
| 9,024,376 B2 | 5/2015 | Masuoka et al. | |
| 9,425,324 B2 | 8/2016 | Diaz et al. | |
| 9,478,624 B2 | 10/2016 | Colinge et al. | |
| 2021/0407999 A1 | 12/2021 | Huang et al. | |
| 2022/0302275 A1* | 9/2022 | Yu | H10D 30/6757 |
| 2023/0395600 A1* | 12/2023 | Xie | H10D 64/018 |

* cited by examiner

*Primary Examiner* — Victor A Mandala
*Assistant Examiner* — Colleen E Snow
(74) *Attorney, Agent, or Firm* — Foley & Lardner LLP

(57) ABSTRACT

A semiconductor structure includes semiconductor layers stacked vertically over a substrate. The structure includes a gate structure interleaved with the semiconductor layers, where the gate structure wraps around a first end portion of each semiconductor layer. The structure includes dielectric layers stacked vertically over the substrate and interleaved with the semiconductor layers, where a first end portion of each dielectric layer is aligned with a second end portion of each semiconductor layer, which is laterally opposite to the first end portion of each semiconductor layer. The structure includes a metal contact extending vertically to contact the second end portion of each semiconductor layer.

15 Claims, 33 Drawing Sheets

3D ISOLATION OF A SEGMENTATED 3D NANOSHEET CHANNEL REGION

FIELD OF THE DISCLOSURE

This disclosure relates to microelectronic devices including semiconductor devices, transistors, and integrated circuits, including methods of microfabrication.

BACKGROUND

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors or channels thereof are stacked on top of each other. 3D integration, i.e., the vertical stacking of multiple devices such as transistors or channels, aims to overcome scaling limitations experienced in planar devices by increasing transistor density in volume rather than area. Although device stacking has been successfully demonstrated and implemented, various embodiments can include numerous operations, and may include minimum feature distances which limit device density and performance.

SUMMARY

The present disclosure relates to non-planar, or three-dimensional (3D), structures and transistors. The channel regions of the transistors may be oriented to conduct current through the channel in a direction generally parallel with the major surface of the system or chip upon which, or within which, these structures are provided. Multi-channel designs may be utilized to provide cost, performance, and/or design advantages. The techniques and structures described herein provide a higher density of devices using vertically stacked transistors or channels thereof, which allows for a higher 3D density. Further, the vertical self-alignment of transistors pairs can increase density and minimum spacing between one or more vertically stacked transistors of the pair.

One aspect of the present disclosure can be directed to a structure. The structure can include semiconductor layers stacked vertically over a substrate. The structure can include a gate structure interleaved with the semiconductor layers, where the gate structure wraps around a first end portion of each semiconductor layer. The structure can include dielectric layers stacked vertically over the substrate and interleaved with the semiconductor layers, where a first end portion of each dielectric layer is aligned with a second end portion of each semiconductor layer, which is laterally opposite to the first end portion of each semiconductor layer. The structure can include a metal contact extending vertically to contact the second end portion of each semiconductor layer.

Another aspect of the present disclosure can be directed to a structure. The structure can include first semiconductor layers stacked vertically over a substrate. The structure can include second semiconductor layers stacked vertically over the substrate and adjacent the first semiconductor layers. The structure can include a first metal gate structure interleaved with the first semiconductor layers, where the first gate structure wraps around a first end portion of each first semiconductor layer. The structure can include a second gate structure interleaved with the second semiconductor layers, where the second gate structure wraps around a first end portion of each second semiconductor layer. The structure can include dielectric layers stacked vertically over the substrate and interleaved with the first semiconductor layers and the second semiconductor layers, respectively, where a sidewall of each dielectric layer is aligned with a second end portion of each first semiconductor layer and a second end portion of each second semiconductor layer, respectively, the second end portion being laterally opposite to the first end portion of each of the first semiconductor layers and the second semiconductor layers. The structure can include a first metal contact extending vertically to contact the second end portion of each first semiconductor layer. The structure can include a second metal contact extending vertically to contact the second end portion of each second semiconductor layer.

Yet another aspect of the present disclosure can be directed to a method. The method can include forming a stack including alternating sacrificial layers and semiconductor layers over a substrate. The method can include replacing end portions of each sacrificial layer in the stack with a first dielectric layer. The method can include forming a second dielectric layer to surround the stack. The method can include forming a trench to separate the stack. The method can include removing the sacrificial layers to form first openings. The method can include forming a gate structure in the first openings. The method can include patterning the second dielectric layer to form second openings that expose the semiconductor layers. The method can include performing a doping process to source/drain regions in the exposed semiconductor layers. The method can include forming a metal contact along vertical sidewalls of the stack to contact both the first dielectric layer and the semiconductor layers.

3D integration, e.g., the vertical stacking of multiple devices or channels thereof, aims to overcome scaling limitations experienced in planar devices by increasing transistor density in volume rather than area. Although device stacking has been successfully demonstrated and implemented, various embodiments can include numerous operations, and may include minimum feature distances which limit device density and performance. Improved systems and methods to design devices having improved density, performance, or manufacturability is being pursued.

Techniques herein include methods of forming vertical transistors or transistors having vertically stacked channels regions, source regions, or drain regions. Techniques herein enable a memory or logic device to be formed from vertically stacked nanosheets or other layers. The channels can be a three channel transistor wherein drive strength of the transistor can be increased or decreased according to forming additional or fewer channels (e.g., additional vertical or horizontal channels). A channel layer can be substituted for an isolation material, such as a dielectric to form a plurality of isolated transistors. In some embodiments, various portions of the transistors may not be isolated, which can reduce a number of operations (e.g., to create a single transistor with increased drive strength). The transistors can be formed having a defined width, wherein the gate electrode is formed, and subsequently etched back to a lesser width to permit the formation of a dielectric layer to isolate the source and drain regions from the gate electrode. The remaining source and drain regions can be connected to a metal electrode or they can be extended, such as by epitaxial growth (and may thereafter be connected to an electrode or other interconnect.)

In some embodiments, a semiconductor device can include a plurality of nanosheet layers to form a first semiconductor-based transistor and a second, vertically aligned semiconductor-based transistor. A number of semiconductor (e.g., silicon) layers can define a number of channels of the transistor. For example, a semiconductor device having three silicon layers can form a transistor having three channel regions for each transistor. In some embodiments, additional semiconductor-based transistors can be formed along a vertical structure of the semiconductor device or may be laterally offset therefrom. In some embodiments, additional semiconductor layers can define additional channel regions of the transistors, or additional transistors. For example, a semiconductor device having six silicon layers can form one transistor pair having six channel regions, six transistors having one channel region, two transistor pairs having one channel region, and a transistor pair having two regions, and so on. For example, transistors can include a complementary field effect transistor (CFET) pair. Various operations or components of the various embodiments can be substituted, omitted, added, or modified. For example, transistors types can be varied according to a desired application (e.g., p-type or n-type).

These and other aspects and implementations are discussed in detail below. The foregoing information and the following detailed description include illustrative examples of various aspects and implementations, and provide an overview or framework for understanding the nature and character of the claimed aspects and implementations. The drawings provide illustrations and a further understanding of the various aspects and implementations, and are incorporated in and constitute a part of this specification. Aspects can be combined, and it will be readily appreciated that features described in the context of one aspect of the invention can be combined with other aspects. Aspects can be implemented in any convenient form. As used in the specification and in the claims, the singular form of "a," "an," and "the" include plural referents unless the context clearly dictates otherwise. References to "or" may be construed as inclusive so that any terms described using "or" may indicate any of a single, more than one, and all of the described terms.

BRIEF DESCRIPTION OF THE DRAWINGS

Non-limiting embodiments of the present disclosure are described by way of example with reference to the accompanying figures, which are schematic and are not intended to be drawn to scale. Unless indicated as representing the background art, the figures represent aspects of the disclosure. For purposes of clarity, not every component may be labeled in every drawing. In the drawings.

DETAILED DESCRIPTION

Figure 1:
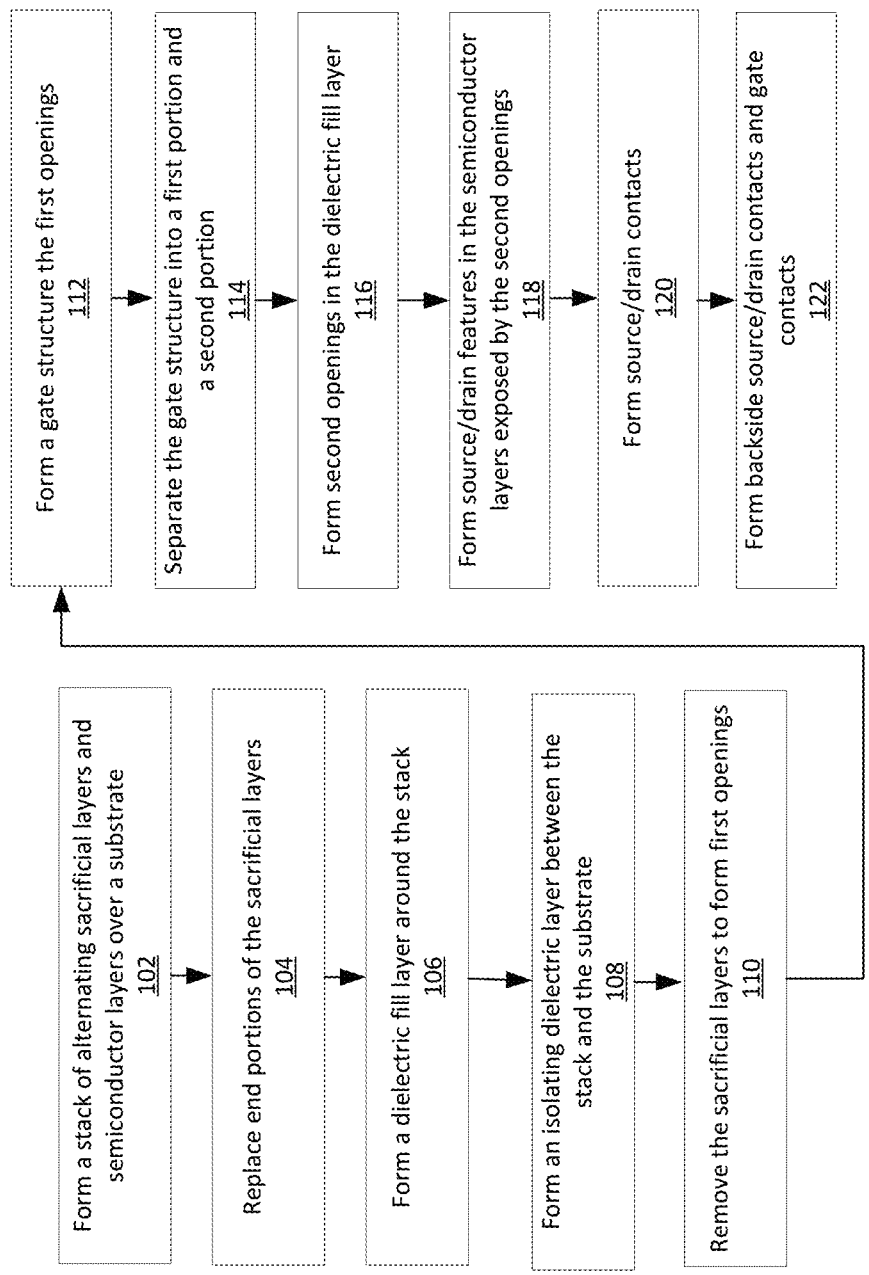
FIG. 1 is a flow chart of a method for making a semiconductor device, in accordance with some embodiments.

Reference will now be made to the illustrative embodiments depicted in the drawings, and specific language will be used here to describe the same. It will nevertheless be understood that no limitation of the scope of the claims or this disclosure is thereby intended. Alterations and further modifications of the inventive features illustrated herein, and additional applications of the principles of the subject matter illustrated herein, which would occur to one skilled in the relevant art and having possession of this disclosure, are to be considered within the scope of the subject matter disclosed herein. Other embodiments may be used and/or other changes may be made without departing from the spirit or scope of the present disclosure. The illustrative embodiments described in the detailed description are not meant to be limiting of the subject matter presented.

Disclosed herein are embodiments related to one or more vertical transistor structures having one or more stacks formed from nanosheets. The stacks can include semiconductor channels such as silicon layers. In some embodiments, silicon germanium sacrificial layers are disposed between the semiconductor channels. Based on a scalable architecture of such semiconductor channels, advantageously, the vertical transistor structures, as disclosed herein, may be scaled in performance or quantity. In some aspects, any number of the vertical transistor structures can be laterally (e.g., side-by-side) arranged with each other and vertically stacked on top of one another, thereby forming an array of vertical transistor structures having improved characteristics in an area efficient manner. In one such example, the array can include pairs of transistors having a reduced spacing dimension therebetween compared to at least some other transistor to transistor spacing dimensions. In another such example, the array can provide multiple channel regions stacked vertically, allowing additional electrodes (or contacts, such as source/drain contacts) to be coupled to the vertical transistor structures in the array.

Reference will now be made to the figures, which for the convenience of visualizing the 3D fabrication techniques described herein, illustrate a substrate undergoing a process flow. Unless expressly indicated otherwise, each figure represents one (or a set) of fabrication steps in a process flow for manufacturing the devices described herein. In the Figures, connections between conductive layers or materials may be shown. However, it should be understood that these connections between various layers and masks are merely illustrative, and are intended to show a capability for providing such connections and should not be considered limiting to the scope of the claims.

Likewise, although the figures and aspects of the disclosure may show or describe devices herein as having a particular shape, it should be understood that such shapes are merely illustrative and should not be considered limiting to the scope of the techniques described herein. For example, although certain figures show various layers defining transistor structures or other electric structures in a rectangular configuration, other shapes are also contemplated, and indeed the techniques described herein may be implemented in any shape or geometry.

FIG. 1 illustrates a flow chart of a method 100 for making a transistor pair, based on a vertical stack structure. For example, the vertical stack structure can be formed by a plurality of nanosheets to form a semiconductor device. The vertical stack structure can include two transistors and an electrical connection therebetween. It is noted that the method 100 is merely an example, and is not intended to limit the present disclosure. Accordingly, it is understood that additional operations may be provided before, during, and after the method 100 of FIG. 1, and that some other operations may only be briefly described herein.

In various embodiments, operations of the method 100 may be associated with top views and cross-sectional views of an example semiconductor device (also referred to herein as a structure) at various fabrication stages as shown in FIGS. 2 to 16, which will be discussed in further detail below. It should be understood that the semiconductor device, shown in FIGS. 2 to 16, may include a number of other devices such as inductors, fuses, capacitors, coils, etc., while remaining within the scope of the present disclosure.

In brief overview, the method 100 starts with operation 102 of forming a stack of alternating sacrificial layers and semiconductor layers over a substrate. The method 100 continues to operation 104 of replacing end portions of the sacrificial layers with dielectric layers by an indent etch process. The method 100 continues to operation 106 of forming a dielectric fill layer around the stack. The method 100 proceeds to operation 108 of forming an isolating dielectric layer between the stack and the substrate. The method 100 proceeds to operation 110 of removing the sacrificial layers to form first openings. The method 100 proceeds to operation 112 of forming a gate structure in the first openings. The method 100 proceeds to operation 114 of separating (or cutting) the gate structure into a first portion and a second portion. The method 100 proceeds to operation 116 of forming second openings in the dielectric fill layer. At operation 118, source/drain features are formed in portions of the semiconductor layers exposed in the second openings. At operation 120, source/drain contacts are formed connect to the source/drain regions. At operation 122, electrodes are formed to connect to the gate structure and the source/drain regions.

Figure 2:
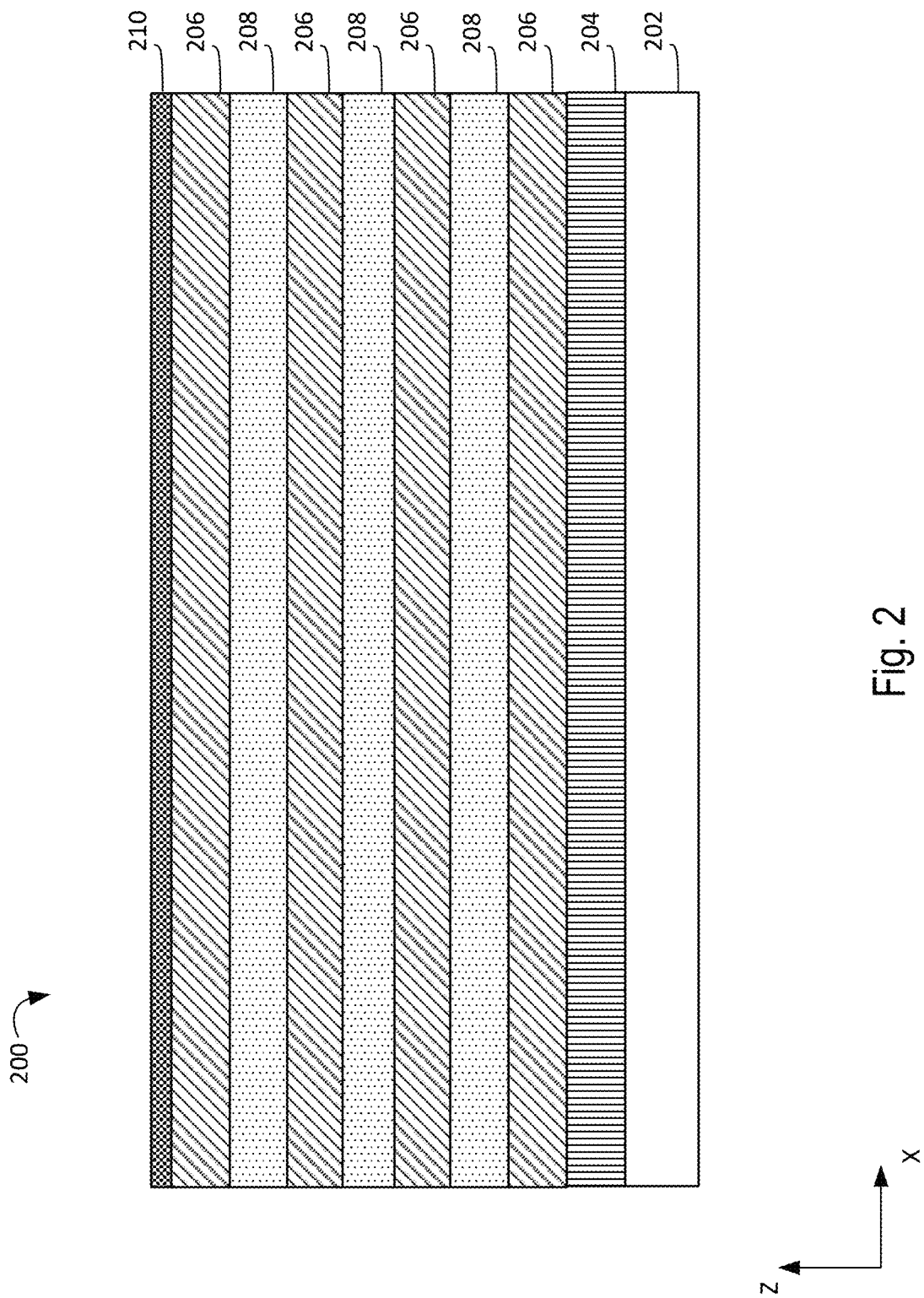
FIGS. 2, 3, 5, 6, 7, 8, 9, 11, 12, 13A, 13B, and 15 each illustrate a cross sectional view of a semiconductor device during various fabrication stages, made by the method of FIG. 1, in accordance with some embodiments.

Corresponding to operation 102 of FIG. 1, FIG. 2 is a cross sectional view of a semiconductor device 200 in which a plurality of layers (e.g., blanket layers), including a plurality of materials, are formed over a substrate 202 (e.g., a crystalline silicon, a glass substrate, etc.), in accordance with various embodiments.

As shown in FIG. 2, a substrate isolating layer 204 can be formed over the substrate 202. The substrate isolating layer 204 and the various additional dielectric and conductive layers and materials herein can be placed, grown, (e.g., epitaxially with or without a seed layer), or otherwise formed to create layers of the semiconductor device 200. The layers can also be referred to as films, channels, or according to their constituent materials. The formation of the various layers of the semiconductor device 200 can include planarization of the layers, such as by cutting, ablation, chemical mechanical grinding or polishing (CMG/P), or other planarization techniques. The substrate isolating layer 204 can be or include a material which can be selectively etched, relative to one or more adjacent materials, such as the substrate 202 and a sacrificial material layer 206. For example, the substrate isolating layer 204 can be formed from silicon-germanium (SiGe) of a first molar ratio, the substrate 202 can be formed from crystalline silicon, and the sacrificial material layer 206 can be formed from SiGe of a second molar ratio different from the first molar ratio. Thus, the substrate isolating layer 204 can be an epitaxially grown sacrificial nanosheet layer which can be selectively removed without removing one or more adjoining layers.

The sacrificial material layer 206 is formed over the substrate isolating layer 204. The sacrificial material layer 206 can include a different material than the substrate isolating layer 204. For example, the sacrificial material layer 206 can be an epitaxially grown SiGe layer, as discussed above. A semiconductor layer 208 can be formed over the sacrificial material layer 206. The semiconductor layer 208 can be or include a semiconductor material such as elementary silicon (e.g., intrinsic silicon), which may be epitaxially grown over the sacrificial material layer 206. The semiconductor layer 208 includes a different material (e.g., an additional, fewer, or different ratio of a material) relative to the sacrificial material layer 206, even where the sacrificial material layer 206 includes a semiconductor as in the example of SiGe. An additional sacrificial material layer 206 can be formed (e.g., epitaxially grown) over the semiconductor layer 208. The sacrificial material layer 206 can be or include a dielectric or semiconductor that can be selectively etched relative to the semiconductor material of the semiconductor layer 208. Another semiconductor layer 208 can be formed on the surface of the semiconductor device 200. The sacrificial material layer 206 and the semiconductor layer 208 may be collectively referred herein as nanosheets of the semiconductor device 200.

Any number of additional semiconductor layers 208 can be formed over the semiconductor device along the Z-axis. For example, the additional semiconductor layers 208 can be disposed between alternating layers of sacrificial material layers 206. In some embodiments, additional isolating layers 204 can isolate portions of the semiconductor device (e.g., to isolate between vertically stacked transistors formed according to the systems and methods disclosed herein). The semiconductor layers 208 can be formed as a doped semiconductor (e.g., epitaxially grown with a dopant or dopant precursor), or formed and thereafter doped such as by diffusion or ion implantation. For example, at least one layer can be an n-type semiconductor or at least one layer can be a p-type semiconductor. As discussed above, in some embodiments the semiconductor layers 208 can be or include an intrinsic semiconductor such as intrinsic silicon (i.e., without any dopant). A cap layer 210 of the semiconductor device 200 can be formed (e.g., deposited) over the upper surface of the semiconductor device (e.g., as an uppermost blanket layer). The cap layer 210 can be a protectant from environmental or processing operations (e.g., the methods disclosed herein). For example, the cap layer 210 can be a hard mask including a suitable dielectric material, such as silicon oxide, silicon nitride, or the like. In some embodiments, additional or fewer sacrificial or semiconductor layers 208 may be formed. For example, although the transistors of the various embodiments disclosed herein are tri-gate transistors (e.g., comprising three source/drain layers), transistors may be formed of additional or fewer source/drain layers (e.g., dual-gate transistors or quad-gate transistors). The tri-gate transistors are sometimes referred to as nano-fork or fork-sheet devices.

Figure 3:
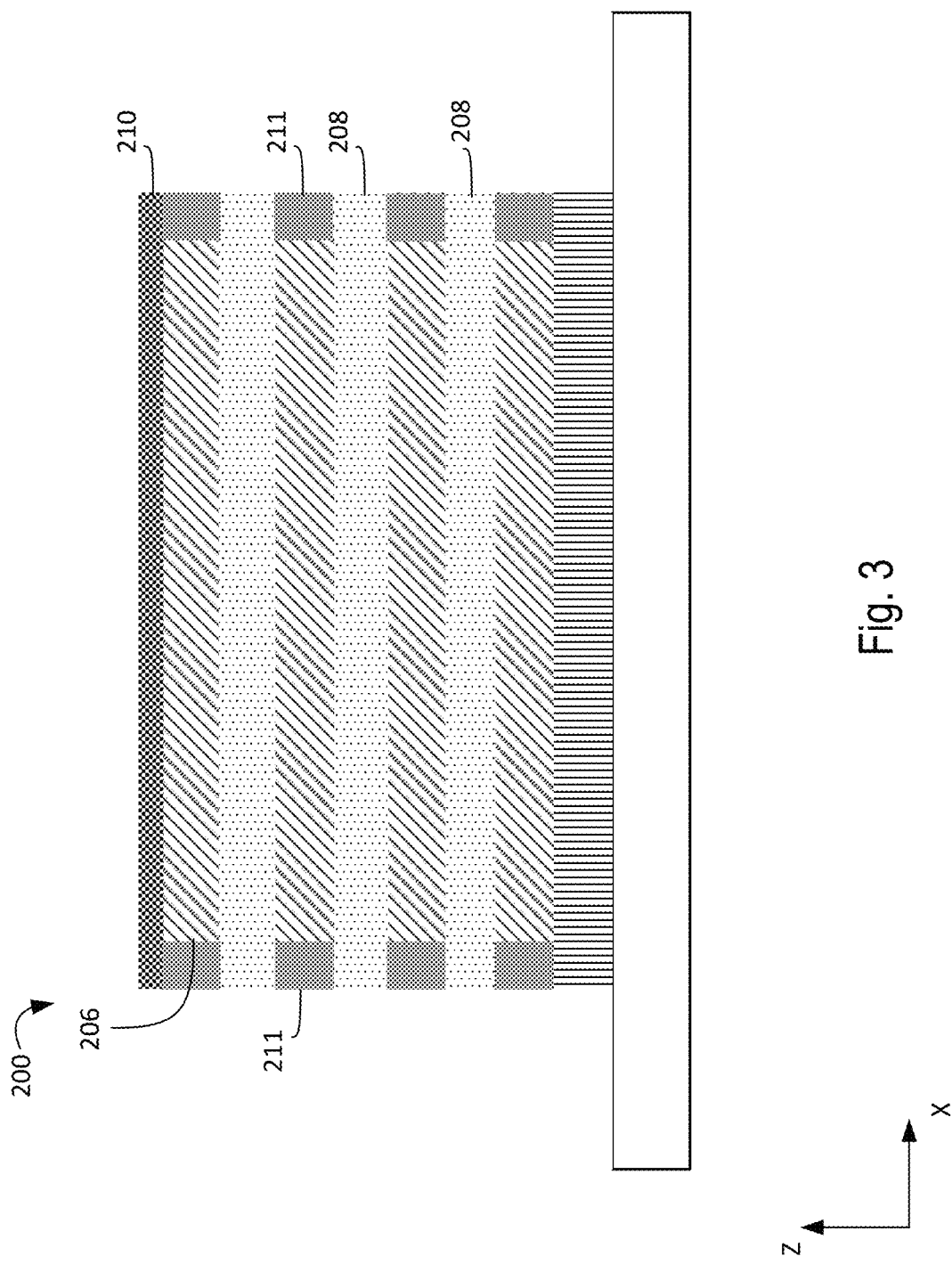

Corresponding to operation 104 of FIG. 1, FIG. 3 is a cross sectional view of the semiconductor device 200 in which the alternating nanosheets 206 and 208 (and the substrate isolating layer 204) are patterned and end portions of each sacrificial material layer 206 are removed by a selective, indent etching process, in accordance with various embodiments. A mask (not depicted) defines a first portion of the semiconductor device 200 for etching, and a second portion of the semiconductor device 200 to remain. The remaining portions of each type of nanosheet of the semiconductor device 200 can be referred to herein as stacks. To etch the first portion, a first patternable layer (e.g., a photoresist material) can be formed over a top surface of the semiconductor device 200. The layers of the semiconductor device 200 can be etched to a depth that exposes the substrate 202. For example, the etchant can be timed to etch to the substrate 202, the substrate 202 can be non-reactive with the etchant, or an etch stop layer can be disposed along a surface of the substrate 202. The etching process may be anisotropic and/or isotropic. The photoresist material can subsequently be stripped from the semiconductor device 200.

Due to difference in compositions, the sacrificial material layers 206 can be selectively etched with respect to the semiconductor layers 208 and the substrate isolating layer 204. The selective etching process can be implemented to form indents (or recesses; not depicted) at end portions of each sacrificial material layer 206. For example, an etchant selective to the sacrificial material layer 206 (e.g., SiGe layer having the first molar ratio) can be timed to form the indents. A dielectric layer 211 is subsequently formed over the semiconductor device 200 to fill the indents. Portions of the dielectric layer 211 formed over the surface of the semiconductor device 200 (e.g., over the cap layer 210) and adjacent the stack of nanosheets 206 and 208 are removed by an etching process and/or a planarization process such as CMG/P, such that outer sidewalls (or edges) of the dielectric layer 211 are vertically aligned with outer sidewalls of the cap layer 210. In this regard, multiple portions of the dielectric layer 211 (alternatively referred herein as multiple dielectric layers 211) are interleaved with the semiconductor layers 208.

Figure 4:
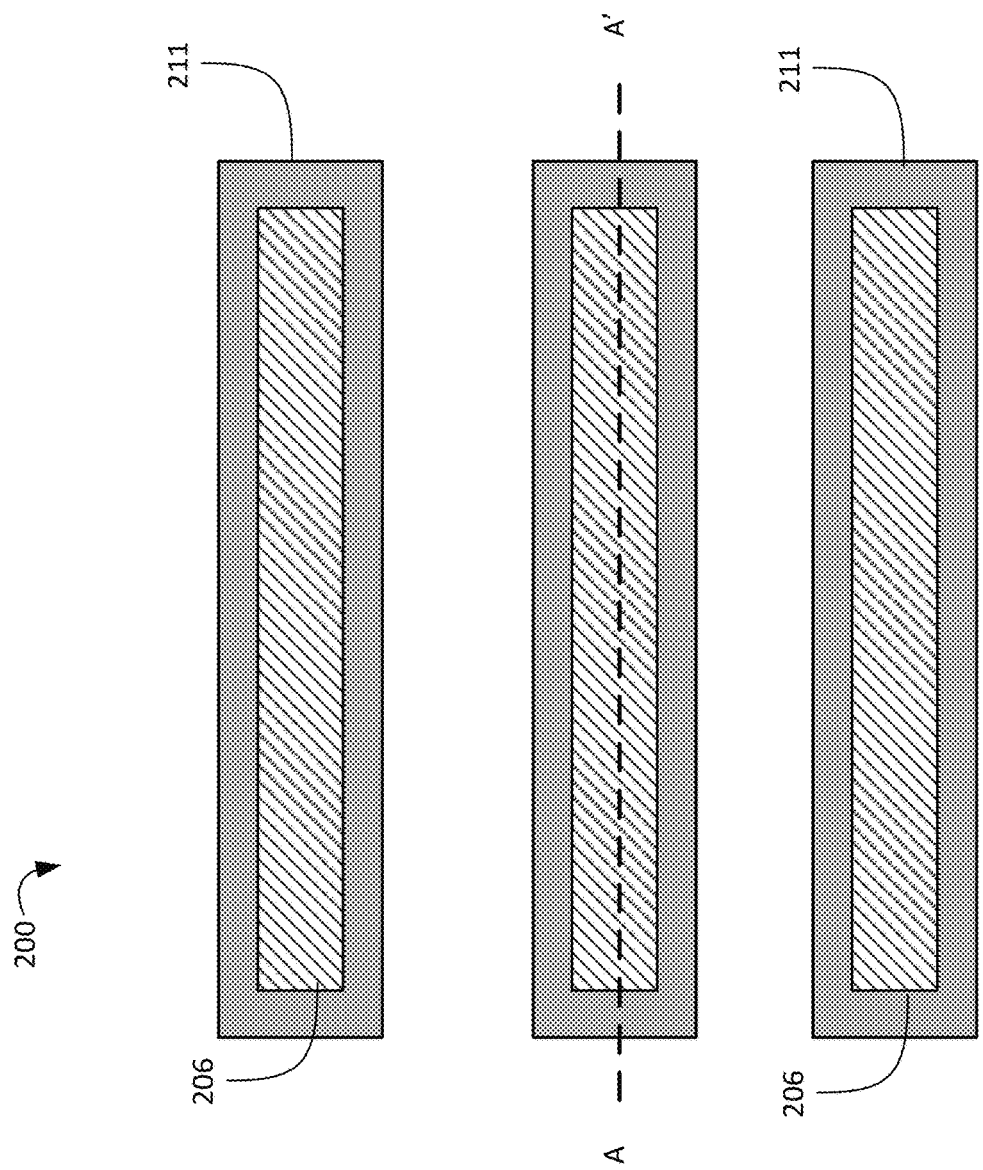
FIGS. 4, 10, 14, and 16 each illustrate a top view of a semiconductor device during various fabrication stages, made by the method of FIG. 1, in accordance with some embodiments.

FIG. 4 is a top view of the semiconductor device 200, which depicts three of the stack of nanosheets depicted in FIG. 3, disposed laterally (e.g., along the Y-axis) offset therefrom and with the cap layer 210 removed to show further details. In some embodiments, additional stacks can be disposed laterally offset from the depicted stacks along the Y-axis, the X-axis, or a combination thereof. A cross sectional view along line AA' corresponds to FIG. 3 described above. The indents are formed to surround each sacrificial material layer 206 on all surfaces thereof, such that the dielectric layer 211 forms an enclosure around each sacrificial material layer 206. In this regard, the dielectric layer 211 forms isolation along outer sidewalls of the sacrificial material layer 206 to allow a contact or electrode (e.g., configured to supply a back bias) to be formed along a vertical sidewall of the stack of nanosheets and coupled to the semiconductor layers 208 without shorting a gate structure subsequently-formed in place of the sacrificial material layer 206.

Figure 5:
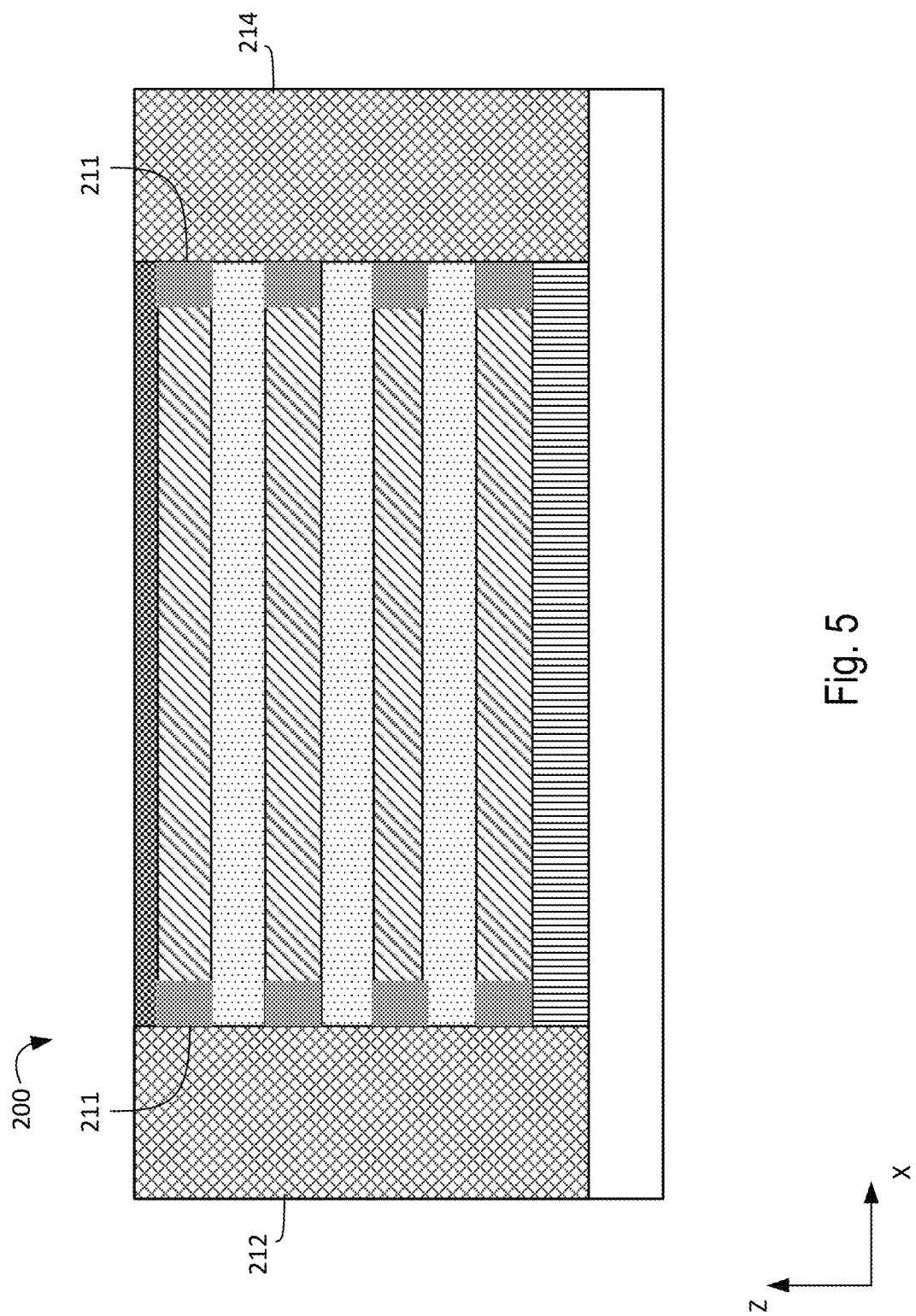

Corresponding to operation 106, FIG. 5 is a cross sectional view of the semiconductor device 200 in which a dielectric fill layer is formed over the semiconductor device 200 to surround the stack of the nanosheets 206 and 208, in accordance with various embodiments. The dielectric fill layer can include a first dielectric structure 212 on a first side of the stack and a second dielectric structure 214 on a second side of the stack. After stripping the photoresist material used to pattern the semiconductor device 200, the dielectric fill layer (also referred to herein as a dielectric structure) can be formed in an etched area. For example, the dielectric fill layer can be formed by a deposition process (e.g., chemical vapor deposition (CVD), flowable CVD), or another fill process and any dielectric disposed over the surface of the semiconductor device 200 (e.g., over the cap layer 210) can be removed by a planarization process such as CMG/P. The etching can leave vertical structures (e.g., columns or transistor core stacks) of the plurality of stacks. For example, a plurality of vertical structures can be formed at regular interval to form a device wherein at least one transistor pair is formed from each of the depicted stacks. The first dielectric structure 212 and the second dielectric structure 214 can be connected, such as in a plane parallel to the depicted plane. For example, the dielectric fill layer can contain an array of semiconductor devices 200, wherein a first dielectric structure, with regard to one semiconductor device 200 can be the second dielectric structure with regard to another semiconductor device 200.

Figure 6:
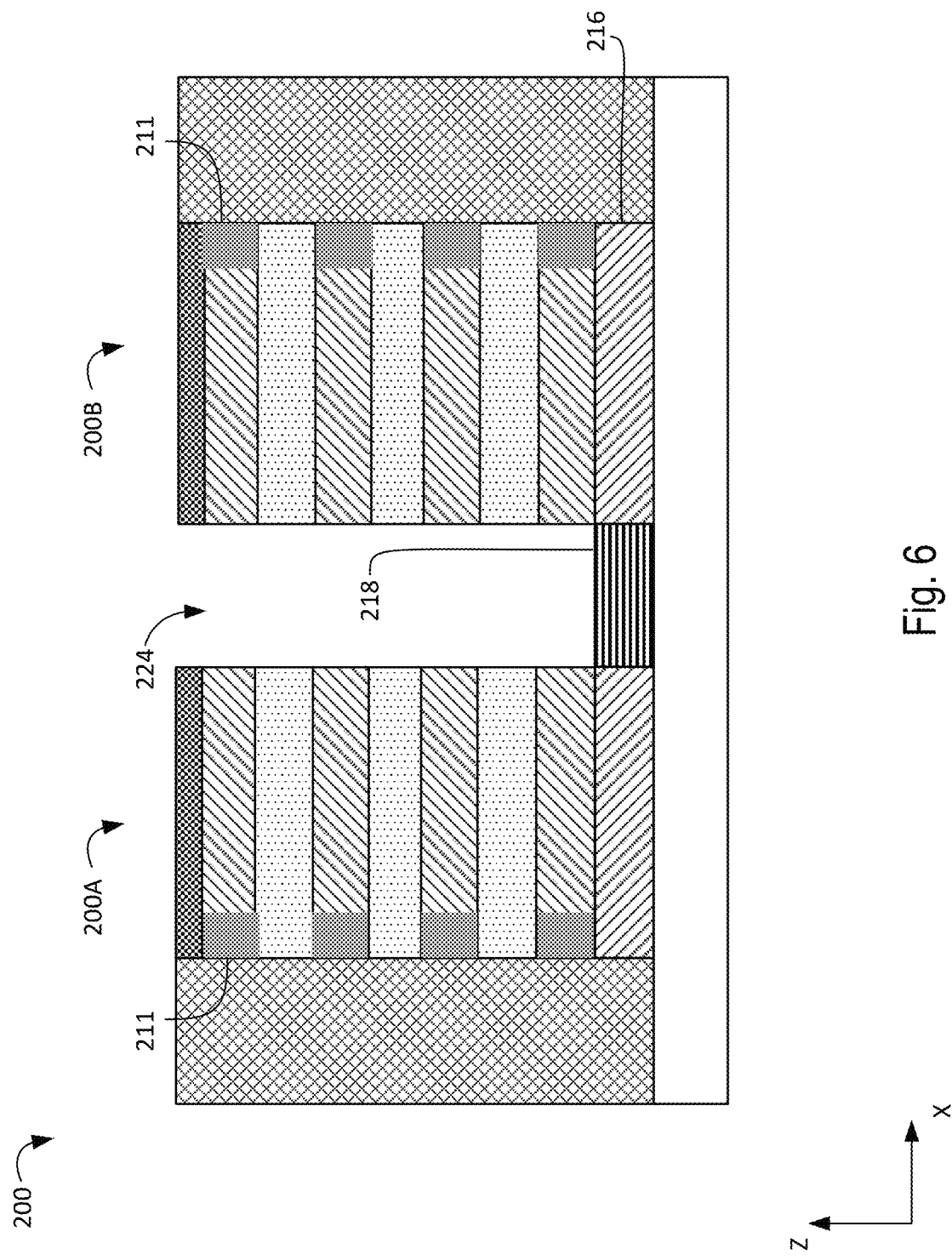

Corresponding to operation 108 of FIG. 1, FIG. 6 is a cross sectional view of the semiconductor device 200 in which a portion of the substrate isolating layer 204 deposited over the surface of the substrate 202 is replaced, in accordance with various embodiments. For example, a cavity (or a trench) 224 is first formed to separate the stack of nanosheets into a first region (or portion) 200A and a second region (or portion) 200B. In this regard, an etchant (e.g., a wet etchant) can be introduced to remove a portion of the substrate isolating layer 204 exposed by the cavity 224. The substrate isolating layer 204 can be a dielectric or a silicon-germanium material of a different mole fraction than the sacrificial films (deposited as sacrificial material layers 206) or other portions of the semiconductor device 200. After removing the portion of the substrate isolating layer 204 directly exposed by the cavity 224, the etchant can be further introduced to the semiconductor device 200 to access and etch the remaining portions of the substrate isolating layer 204 to form an air gap (not depicted) between a bottommost sacrificial material layer 206 and the substrate 202. In some embodiments, an isolating dielectric layer 216 can subsequently be deposited to fill the air gap and a bottom portion of the cavity 224. A directional etching process (e.g., plasma etching process) can then remove a center portion of the isolating dielectric layer 216 exposed in the cavity 224. A (different) center isolating dielectric 218 can be formed to fill the bottom portion of the cavity 224, thereby bridging portions of the isolating dielectric layer 216. The center isolating dielectric 218 includes a material that is resistive to etchants used during further operations of the cavity 224. The center isolating dielectric 218 can be formed according to a defined height (e.g., corresponding to a thickness of the isolating dielectric layer 216), or can be formed to fill the cavity 224 and thereafter etched back.

Figure 7:
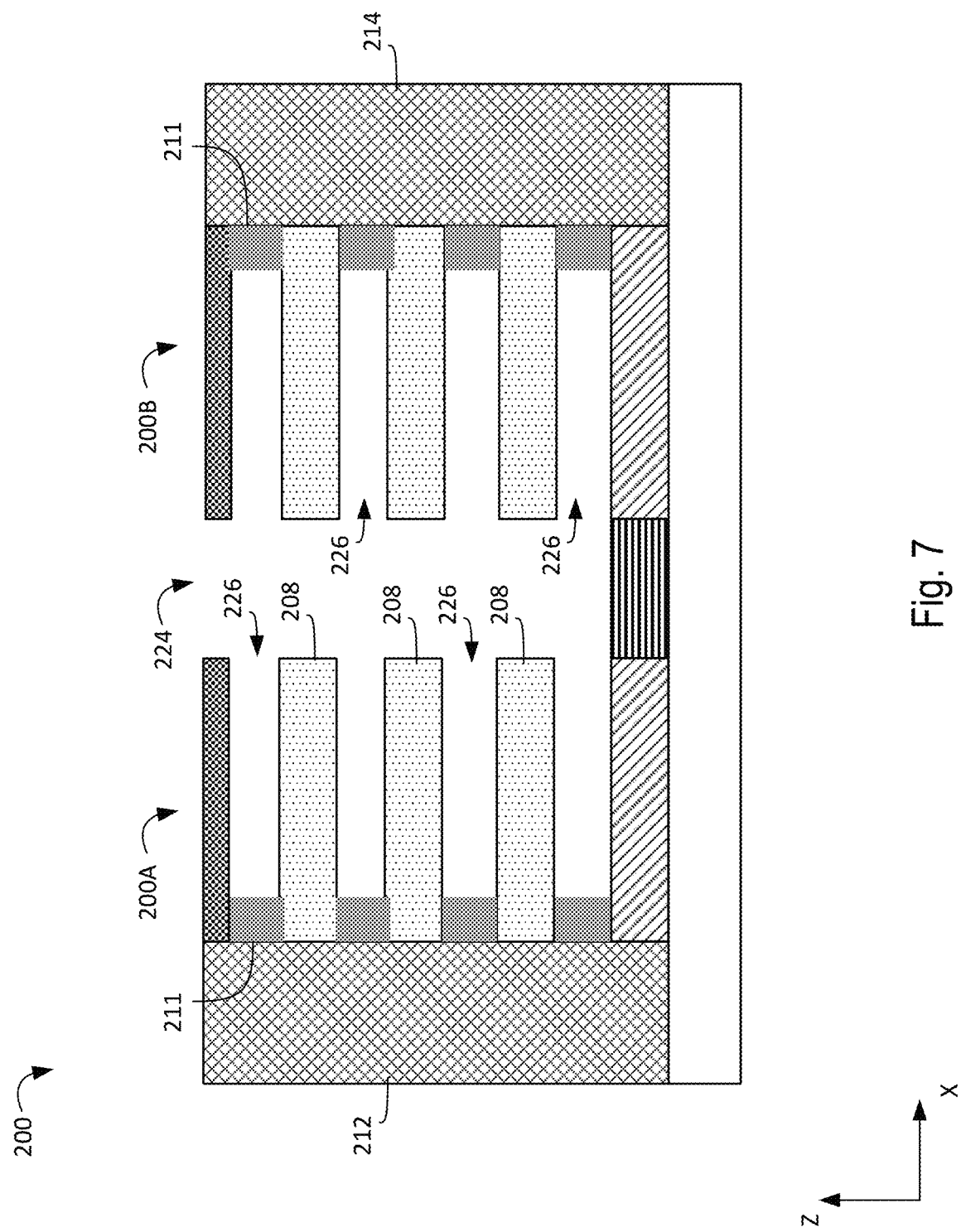

Corresponding to operation 110 of FIG. 1, FIG. 7 is a cross sectional view of the semiconductor device 200 in which the sacrificial material layers 206 are removed from the semiconductor device 200 to form openings 226, in accordance with various embodiments. As shown in FIG. 6, the sacrificial material layers 206 can be selectively etched and removed in similar fashion to the material of the substrate isolating layer 204. For example, an etchant can be introduced through the cavity 224 to remove the sacrificial material layers 206 without removing, or substantially removing, other components of the semiconductor device 200, such as the semiconductor layers 208 and the dielectric layer 211, among others. The selectivity can be based on the material properties of a bulk material or can be based on one or more intermediate layers (e.g., oxidation layers or etch stop layers) formed over the various layers and materials thereof. As depicted, each remaining portion of the semiconductor layer 208 is vertically adjacent the opening 226. Furthermore, each opening 226 exposes a sidewall of the dielectric layer 211.

Figure 8:
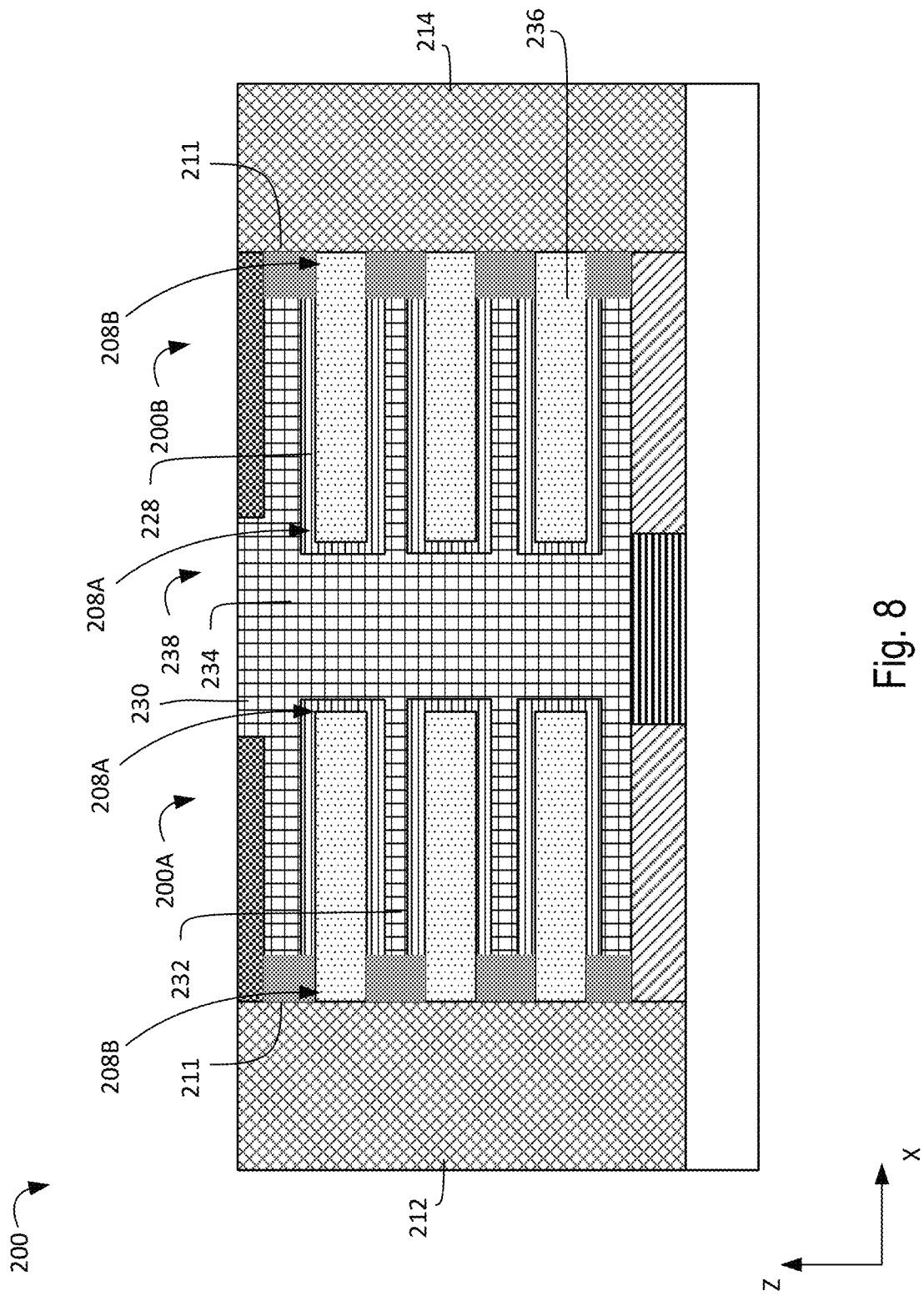

Corresponding to operations 112 of FIG. 1, FIG. 8 is a cross sectional view of the semiconductor device 200 in which a gate structure 238, including a gate dielectric and a gate electrode, is formed, in accordance with various embodiments. A gate dielectric 228 is formed over at least a remaining portion of each semiconductor layer 208 in the openings 226. The gate dielectric 228 can be a high-k dielectric, such as hafnium oxide, lanthanum oxide, or the like. The gate dielectric 228 can be configured to selectively form on the semiconductor (e.g., silicon) of the semiconductor device 200. As shown, the gate dielectric 228 can cover a portion of the semiconductor layer 208 extending away from the dielectric structure 212, 214, i.e., at a first end portion 208A. The first end portion 208A is laterally opposite to a second end portion 208B, which is adjacent the dielectric structure 212, 214. A second portion of the semiconductor layers 208 in contact with the dielectric structure 212, 214 is not covered by the gate dielectric 228. In other words, each of the semiconductor layers 208 may directly interface with the dielectric structure 212, 214 at the second end portion 208B along a sidewall, such that the portions of the respective gate dielectric 228 may not interface directly with the adjacent dielectric structure 212, 214 (e.g., the transistors described herein may not be gate-all-around transistors). Furthermore, the gate dielectric 228 is isolated from the dielectric structure 212, 214 by the dielectric layer 211, while the semiconductor layers 208 directly interface with the dielectric structure 212, 214.

A gate electrode 230 is subsequently formed over the gate dielectric 228. The gate electrode 230 can be formed over the gate dielectric 228 by a deposition process (e.g., CVD, atomic layer deposition, physical vapor deposition (PVD), or the like). For example, one or more metal materials (e.g., alloys, coatings, or elements) can be grown along the gate dielectric 228. In some embodiments, the gate electrode 230 is deposited to fill the cavity 224 and the upper surface of the semiconductor device 200 is thereafter planarized. The gate electrode 230 can be a metal gate electrode. For example, the gate electrode 230 can include cobalt, copper, aluminum, ruthenium, silver, gold, tungsten, the like, or alloys or other combinations (e.g., layers) thereof. The gate electrode 230 can fill the cavity 224 or any evacuated portion of the semiconductor device 200 connected thereto. For example, the gate electrode 230 can fill the openings evacuated by the sacrificial material layers 206, such that the gate electrode 230 can encapsulate the gate dielectric 228. The gate electrode 230 can include a plurality of horizontal portions 232 and a central vertical portion 234 to laterally connect the horizontal portions 232. In this regard, the first end portion 208A is proximal to the central vertical portion 234 and the second end portion 208B is distal to the central vertical portion 234. As depicted in FIG. 8, the horizontal portion 232 of the gate electrode 230 extends to directly interface with the dielectric layer 211, such that the gate electrode 230 is laterally isolated from the dielectric structure 212, 214. In contrast, the semiconductor layers 208 directly interface with the dielectric structure 212, 214.

With further reference to FIG. 8, the material of the semiconductor layers 208 can be defined according to a function thereof. The semiconductor layers 208 can be defined as channels or channel regions 236 of the semiconductor device 200. The channel regions 236 may also be referred to as semiconductor channels. In some embodiments, channel regions 236 separated by the cavity 224 (e.g., in the respective device regions 200A and 200B of the stack) can be channel regions 236 of a same single transistor. For example, the transistor can include one or more (e.g., three) vertically stacked channel regions 236 engaged with the gate electrode 230 (i.e., the central vertical portion 234) that extends continuously across the cavity 224. In some embodiments, the central vertical portion 234 of the gate electrode 230 can have a lateral dimension (e.g., a width) to allow for a lithographic process to form a separation therebetween (e.g., to form the dielectric spacer 240 of FIG. 9). For example, the vertical portion 234 of the gate electrode 230 can be at least 100 nm in width. In some embodiments, the dimension between the channel regions 236 is less than a distance to support one or more lithographic techniques, and any etching/deposition processes to form a dielectric spacer (e.g., dielectric spacer 240). Such channel regions can be, for example, less than 100 nm in dimension between gate structures (e.g., in a range of 15-25 nm).

Figure 9:
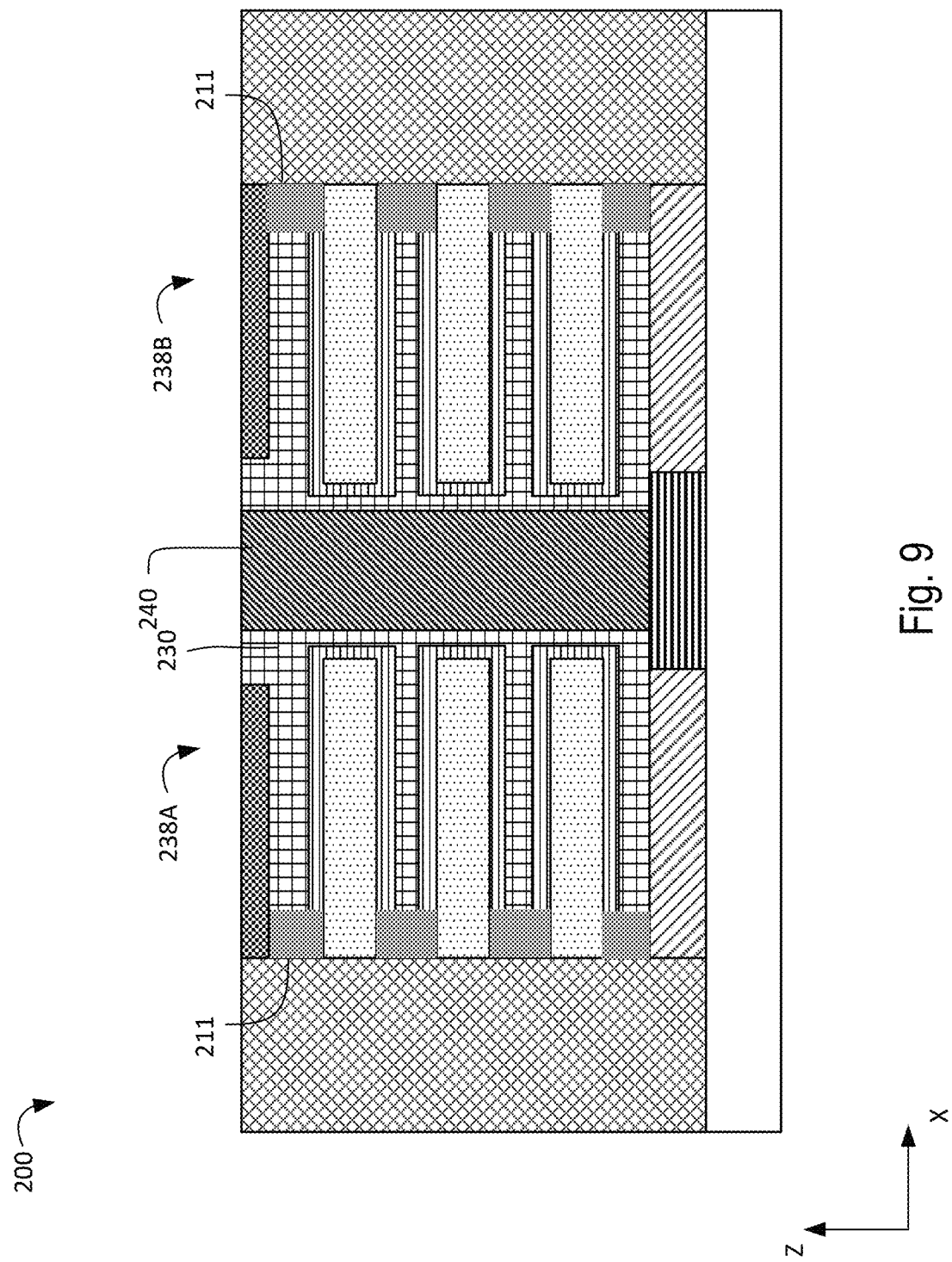

Corresponding to operations 114 of FIG. 1, FIG. 9 is a cross sectional view of the semiconductor device 200 in which a dielectric spacer 240 is formed between channel regions 236. The dielectric spacer 240 can be formed according to an operation similar to operation 104. For example, the center portion of the central vertical portion 234 of the gate electrode 230 can be masked and etched to form a cavity (not depicted), thereafter filled with a dielectric, and planarized along an upper surface of the semiconductor device 200. The dielectric of the dielectric spacer 240 can be the same dielectric of the dielectric fill layer or another dielectric of the semiconductor device 200. In this regard, the gate structure 238 is cut or separated by the dielectric spacer 240 into a first portion 238A and a second portion 238B, which can be independently processed to form two different gate structures corresponding to different types of transistors. In the present example, the first portion 238A and the second portion 238B are configured to form two independent transistors of the same conductivity type, where each transistor includes three channel layers. This operation, like other operations described herein, can be omitted, substituted, or modified. For example, embodiments maintaining an electrical connection between the laterally offset channel regions 236 can omit this dielectric spacer (e.g., a gate cut feature) 240. In this regard, the semiconductor device 200 is configured as a single transistor having six channel layers.

Figure 10:
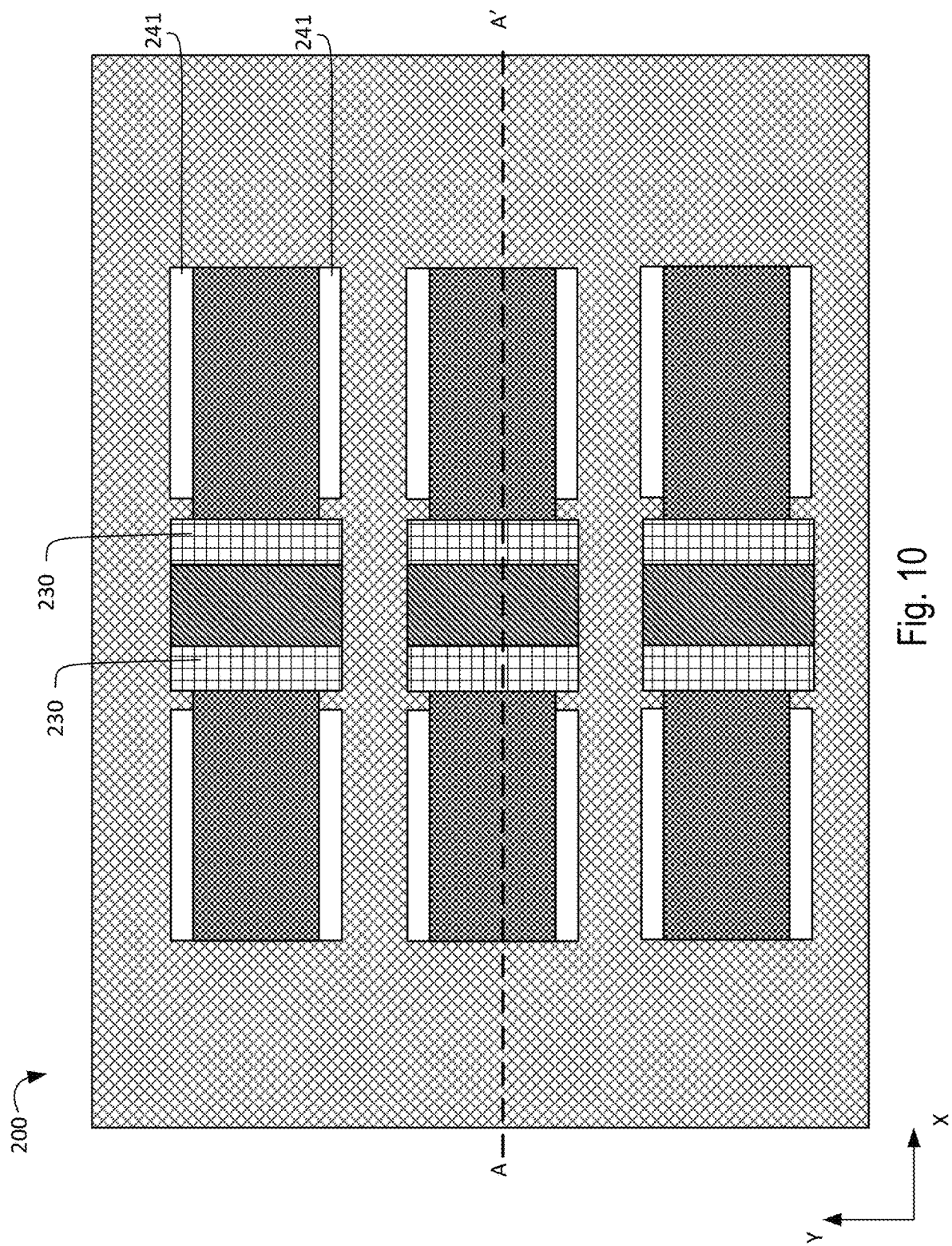

Corresponding to operation 116 of FIG. 1, FIG. 10 is a top view of the semiconductor device 200 in which openings 241 are formed, in accordance with various embodiments. As shown in FIG. 5, the openings 241 are formed in the semiconductor device 200 by directionally etching the surface of the semiconductor device 200 toward the substrate 202. For example, a mask (not depicted) can define the openings 241 in the dielectric fill layer, and the openings can thereafter be formed according to an operation similar to operation 104. The openings 241 can be disposed along one or more layers of the semiconductor device 200. The openings 241 can expose the substrate 202 as viewed from the top of the device, or the isolating dielectric layer 216 or the center isolating dielectric 218. For example, the openings 241 can extend at least to the upper surface of the isolating dielectric layer 216 or the center isolating dielectric 218 of the semiconductor device 200, which may ease an egress of the etched material from the openings 241. The openings 241 can extend for all or a portion of the lateral dimensions of the semiconductor layers 208.

Figure 11:
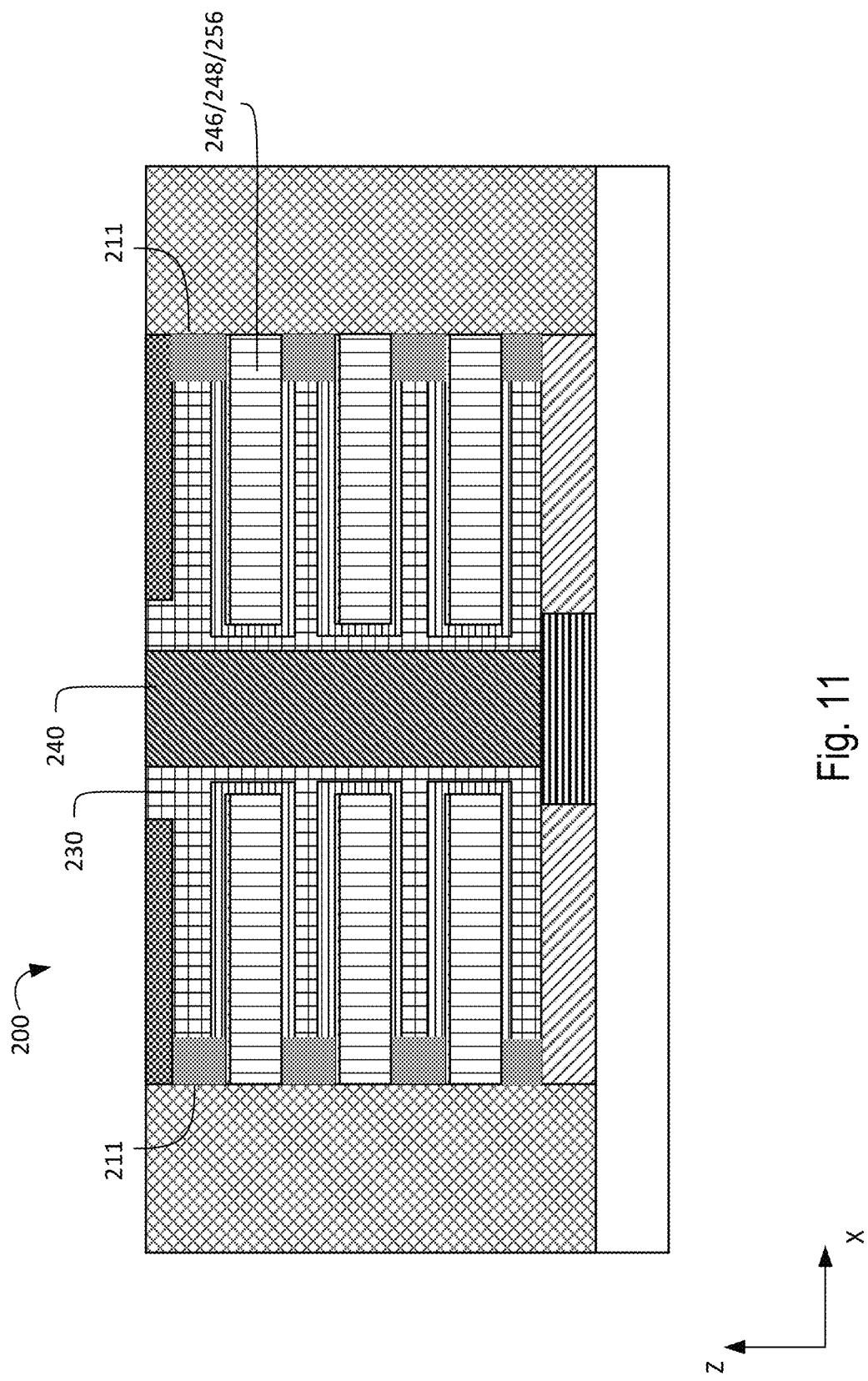

Corresponding to operation 118 of FIG. 1, FIG. 11 is a cross sectional view of the semiconductor device 200 in which the source/drain regions 246, 248 are prepared for connection, in accordance with various embodiments. Preparing the source/drain regions 246, 248 for connection can include doping or otherwise treating/activating the source/drain regions 246, 248 for connection to a source or drain electrode, forming or processing the source or drain electrodes for connection to an interconnect structure to interconnect a plurality of transistors, or a formation of another intermediate layer. In some examples, the source/drain regions 246, 248 may be doped with one or more suitable dopant to form semiconductor source/drain features for connections to a source or drain electrode. In this regard, the doping may form the semiconductor source/drain features in the source/drain regions 246, 248 to replace portions of their semiconductor layer 208. In some examples, an epitaxial growth process may be implemented to form semiconductor source/drain features that extend or protrude from the source/drain regions 246, 248, such that the source/drain features are raised with respect to the semiconductor layer 208. The description of electrodes herein is not exhaustive. For example, although no figure is directed to a formation of a silicide to join the source/drain regions 246, 248 to a source/drain contact, such an operation is within the scope of the present disclosure.

As depicted in FIG. 11, the source/drain regions 246, 248 can be doped (e.g., via the openings 241 or additional openings) to form semiconductor source/drain features, in accordance with various embodiments. For example, the source/drain regions 246, 248 can be doped by a plasma doping process. In some embodiments, a dopant can be deposited (e.g., selectively deposited) over the source/drain regions 246, 248, and can thereafter dope the source/drain regions 246, 248 by a diffusion process (e.g., according to a time-temperature profile). In some embodiments, a plurality of doping operations or dopants can be employed, such as to create a dopant profile along each of the source region 246, drain region 248, or channel region 236. For example, the channel region 236 can include intrinsic silicon or can be doped to a same or different type as the source and drain (e.g., the source, channel, and drain can be doped N-P-N, or P-N-P, respectively). One or more dopants or processes can form a lightly doped region, and another dopant or process can form a more heavily doped region (e.g., of a same or different type). An n-type dopant may include arsenic, phosphorus, or the like, and a p-type dopant may include boron or the like. The type of dopant selected to prepare the source/drain regions 246, 248 depends on the type of transistor desired.

Figure 12:
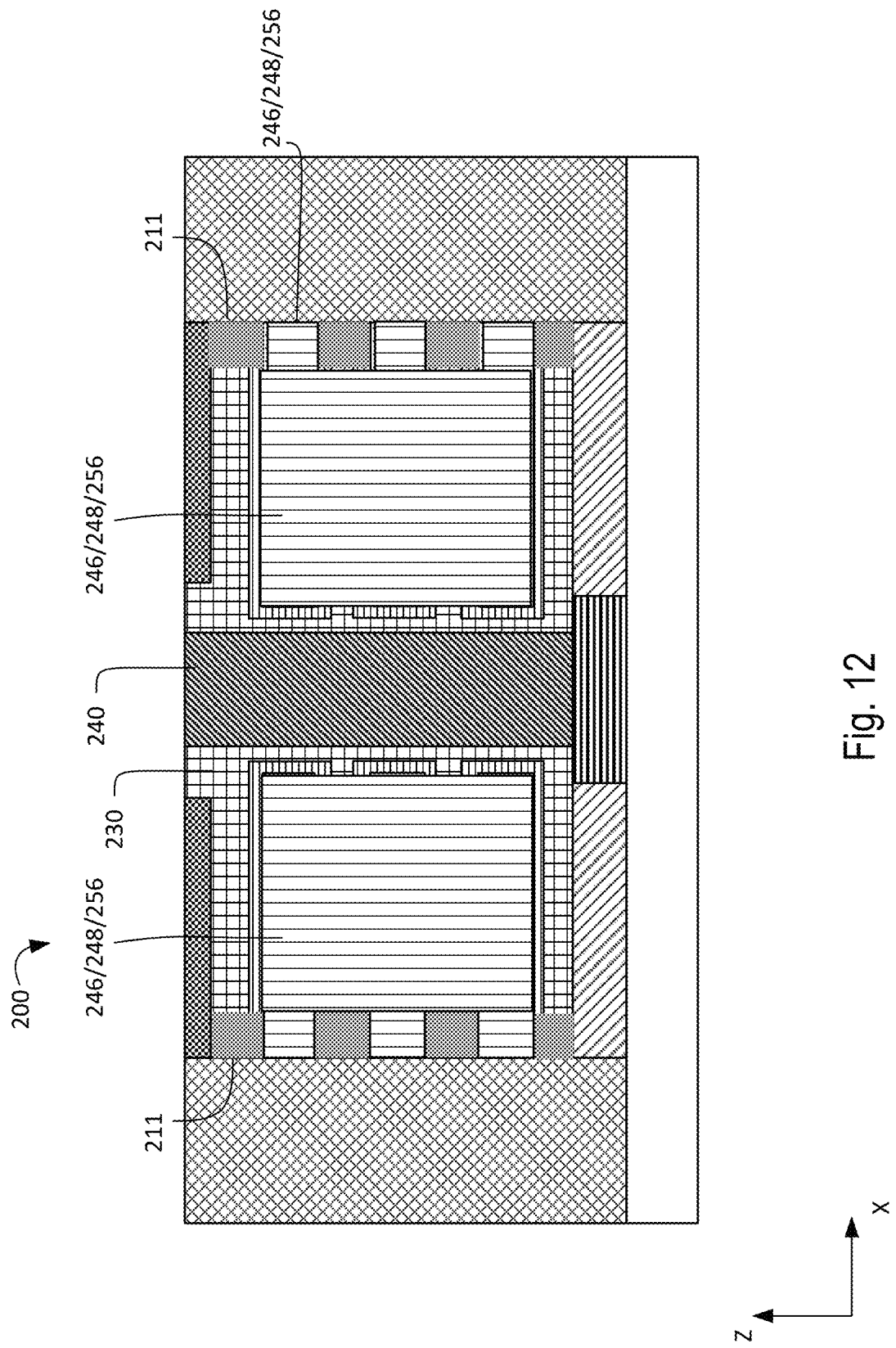

As depicted in FIG. 12, an additional semiconductor material (e.g., semiconductor source/drain features) 256 can be formed over at least a portion of source/drain regions 246, 248. For example, the source/drain regions 246, 248 can be or include silicon and additional silicon can be epitaxially grown thereover. In some embodiments, the additional semiconductor material 256 can be grown over and protrude from each of the source/drain regions 246, 248, such that the additional semiconductor material 256 merges to form a raised, contiguous semiconductor feature over a plurality of the source/drain regions 246, 248. For example, the vertically disposed source/drain regions 246, 248 can each be in electrical contact with a contiguous epitaxially grown region. In some embodiments (e.g., embodiments lacking a dielectric spacer 240), the horizontally disposed source/drain regions 246, 248 can be in electrical contact with a contiguous epitaxially grown region.

The additional semiconductor material 256 can be doped heavily, for example, to electrically connect the source/drain regions to an interconnect structure or a source/drain contact. In some examples, a dopant can be introduced during or following the epitaxial growth. The dopant can be a p-type or n-type dopant. The reverse side (not depicted) of the semiconductor device 200 can include the same additional semiconductor material 256, such that the sources and drains of each transistor of the depicted pair of transistors can have common drains and sources. The dimensions of the additional semiconductor material 256 can vary (e.g., can be disposed over all or a portion of the portion of the source/drain regions 246, 248). For example, an increased horizontal dimension of the additional semiconductor material 256 may reduce a resistance thereof (e.g., to or from electrodes or pads disposed on an upper surface of the semiconductor device 200).

Figure 13A:
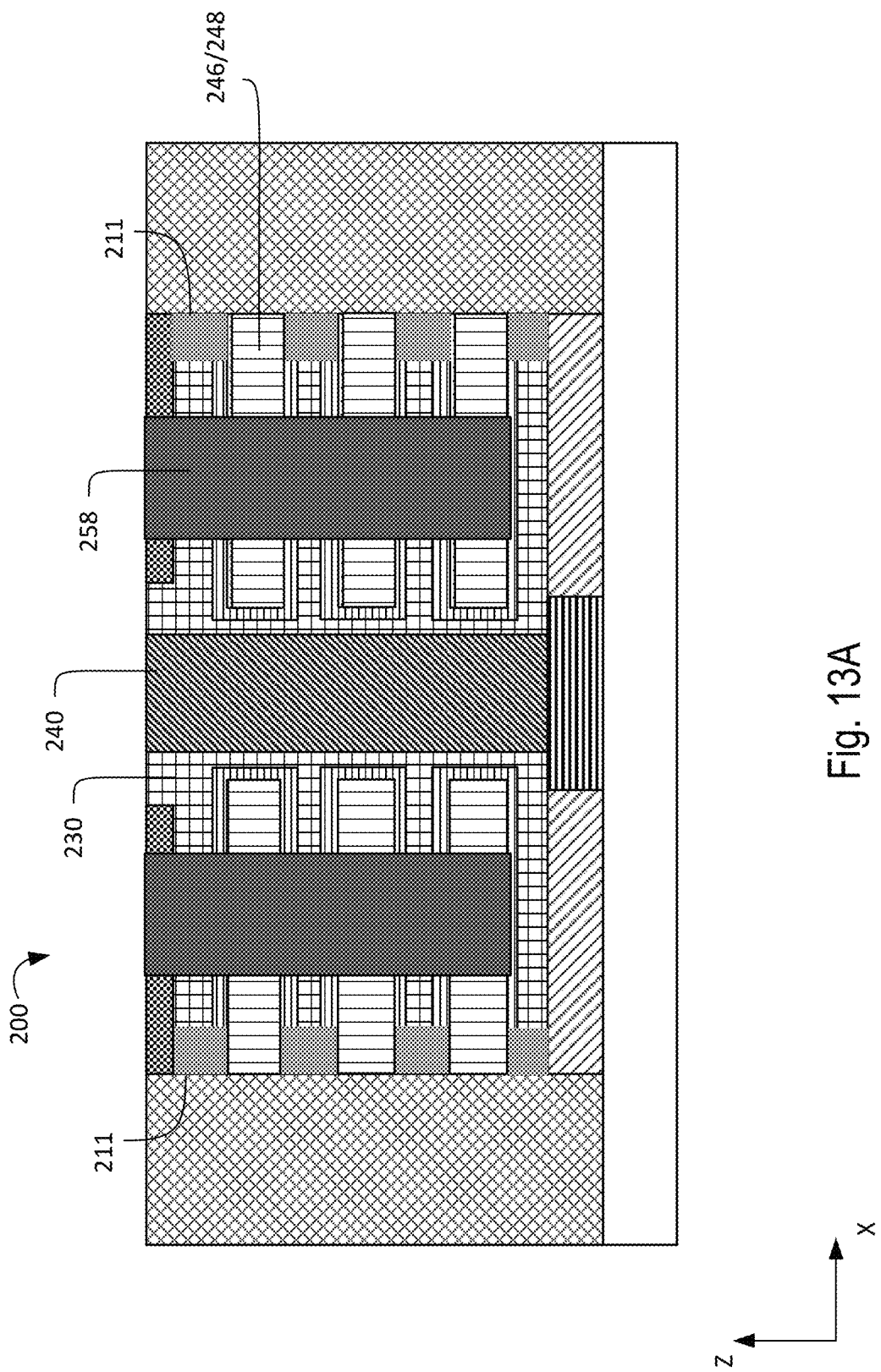
Figure 13B:
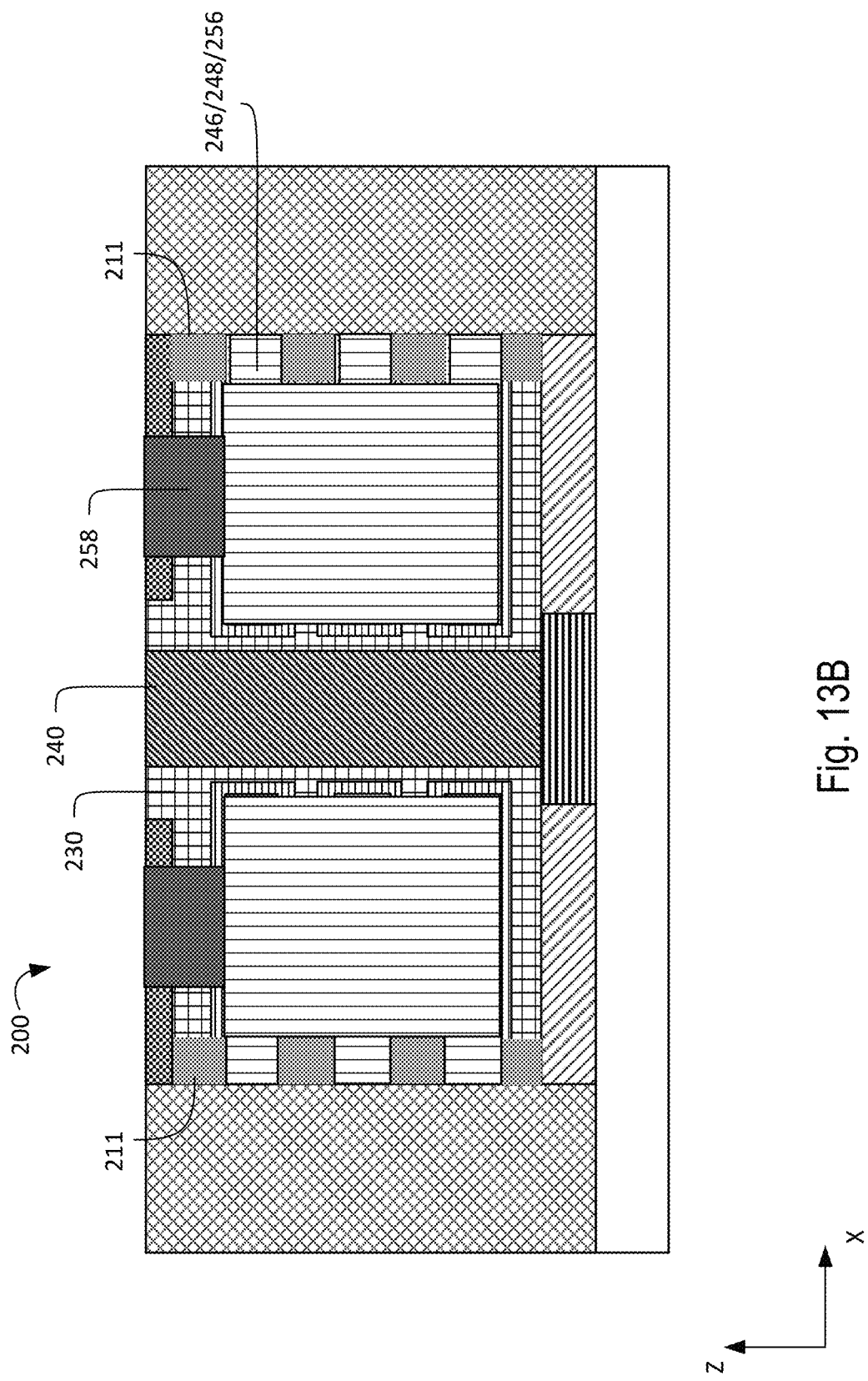

Corresponding to operation 120 of FIG. 1, FIGS. 13A and 13B are each a cross sectional view of the semiconductor device 200 in which source/drain contacts (or source/drain contacts) 258 are formed, in accordance with various embodiments. The electrodes can be formed by forming electrode openings (not depicted) in the dielectric fill layer (e.g., the dielectric structures 212, 214) corresponding to positions of the source/drain contacts 258, performing a deposition process for a metal, such as a selective or nonselective deposition, in the electrode openings, followed by a CMG/P process to remove excess metal. The openings can be formed by a patterning process according to an operation similar to operation 104. In some examples, additional or fewer source/drain contacts 258 can be formed. For example, in some embodiments (e.g., embodiments lacking a contiguous source/drain region 246, 248 across the plurality of layers of the semiconductor device 200), each lateral portion of the semiconductor layer 208 can have a laterally spaced electrode connecting to the source/drain region 246, 248. In some embodiments, such as those lacking a dielectric spacer 240 having a single gate electrode, a single source/drain contact 258 can be formed.

FIG. 13A depicts an embodiment in which the source/drain regions 246, 248 are doped (e.g., by plasma doping) to form the source/drain features in the respective semiconductor layers 208, in correspondence to FIG. 11. In this regard, the respective source/drain regions 246, 248 are vertically separated, and the source/drain contacts 258 can be formed to vertically extend over a sidewall of each source/drain region 246, 248 along the stack. FIG. 13B depicts an embodiment in which the additional semiconductor material 256 is formed over and electrically connects the source/drain regions 246, 248 across different semiconductor layers 208, in correspondence to FIG. 12. In this regard, the source/drain contacts 258 can be formed to provide connection to the vertically stacked source/drain regions 246, 248 by being physically coupled to an upper portion of the source/drain regions 246, 248 and the additional semiconductor material 256. In some examples, additional or fewer source/drain contacts 260 can be formed.

Figure 14:
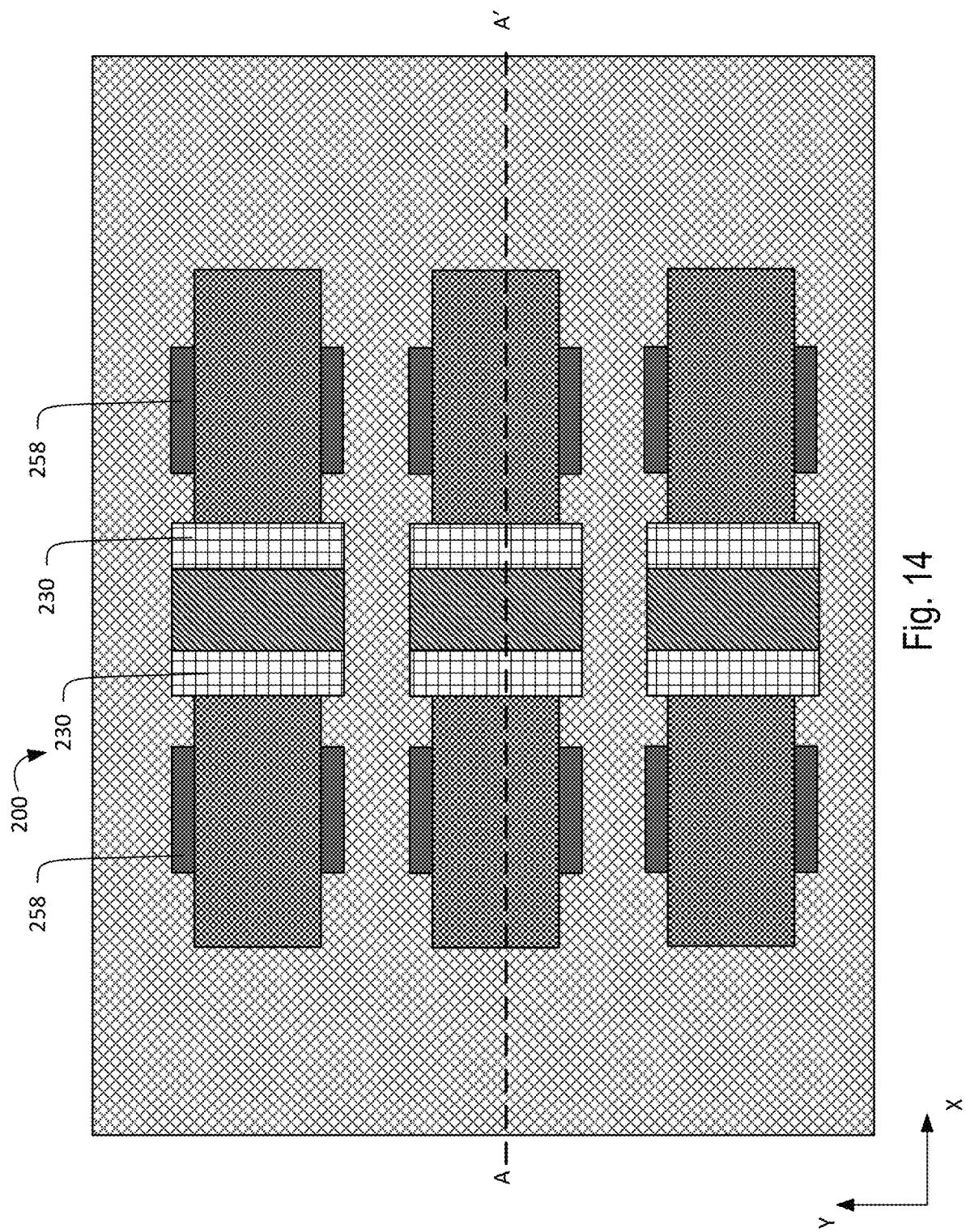

FIG. 14 is a top view of the semiconductor device 200 corresponding to FIGS. 13A and 13B in which the source/drain contacts 258 are formed, in accordance with various embodiments. In this regard, the source/drain contacts 258 are formed on respective sidewalls of the stack separated along the Y-axis as shown. The embodiment of FIG. 13A (or 13B) can be a cross sectional view of the semiconductor device 200 along the line AA' indicated in FIG. 14.

Figure 15:
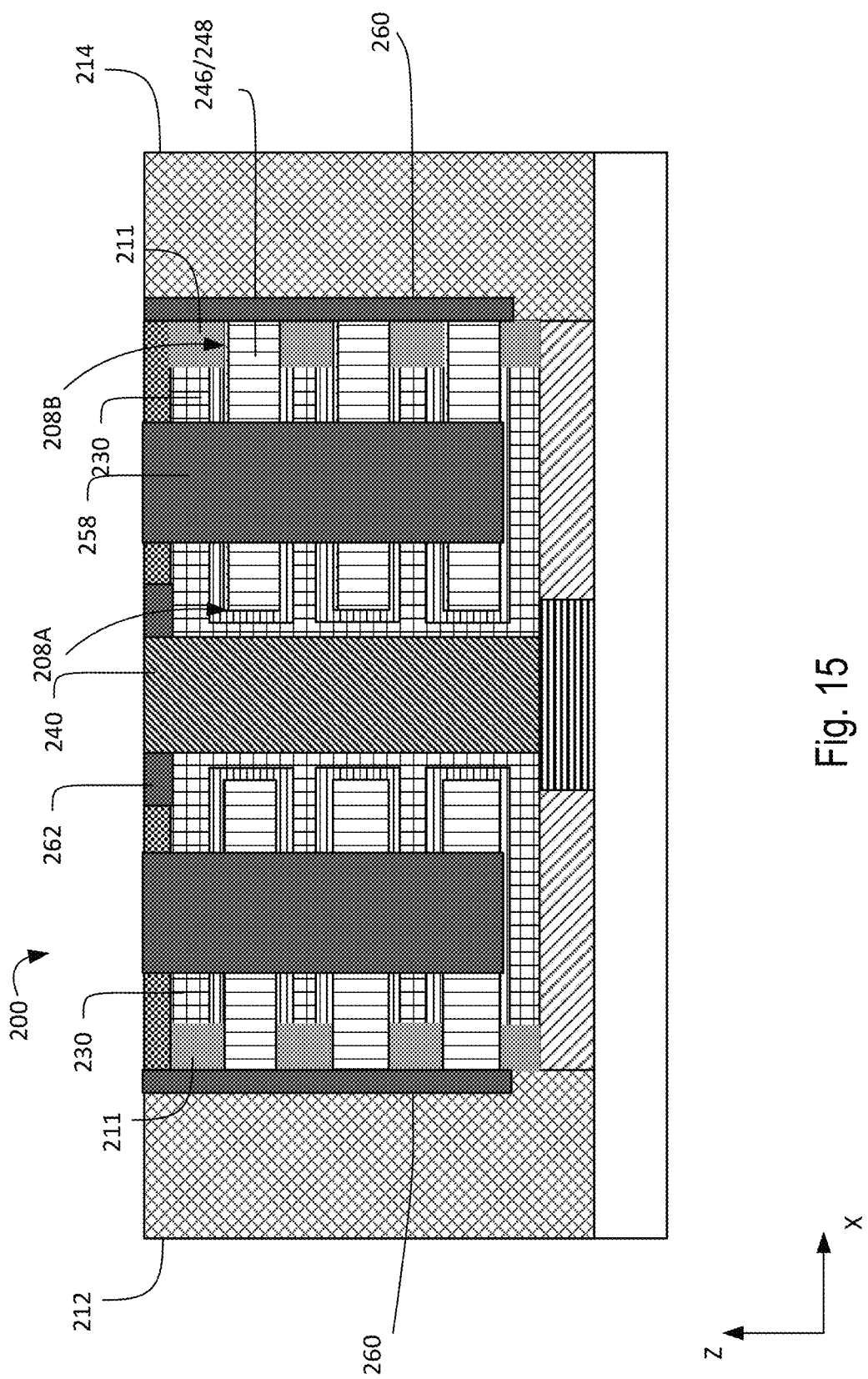

Corresponding to operation 122 of FIG. 1, FIG. 15 is a cross sectional view of the semiconductor device 200 in which additional electrodes (or contacts) are formed to electrically couple to the source/drain regions 246, 248 (and 256, if applicable) and/or the gate electrode 230, in accordance with various embodiments. For example, additional source/drain contacts 260 are formed along a sidewall of the stack that interfaces with the respective dielectric structure 212, 214. In this regard, the source/drain contacts 260 may alternatively be referred to as backside source/drain contacts 260. The source/drain contacts 260 can be formed by patterning the dielectric structures 212, 214 to form a cavity (or opening; not depicted) according to an operation similar to operation 104 and deposits a conductive material to form the source/drain contacts 260 according to an operation similar to operation 120. In some embodiments, the cavity extends vertically to expose a sidewall of at least a bottommost source/drain regions 246, 248 (i.e., the semiconductor layers 208) of the stack. As such, the source/drain contacts 260 vertically extend over sidewalls of both source/drain regions 246, 248 (at the second end portion 208B) and the dielectric layer 211, which is interleaved with the source/drain regions 246, 248, without contacting the gate electrode 230. In other words, the dielectric layer 211 isolates the source/drain contacts 260 from the gate electrode 230, thereby allowing connections (e.g., for back biases) be made for the source/drain regions 246, 248 (and 256, if applicable) at the second end portion 208B in addition to the source/drain contacts 258, which is formed at the first end portion 208A opposite the second end portion 208B.

In some embodiments, gate contacts 262 are also formed to provide electrical connection to interconnect structures (e.g., vias, conductive lines, etc.). The gate contacts 262 can be formed by patterning the cap layer 210 according to a similar operation as operation 104 to form openings (not depicted) and depositing a conductive material in the openings according to a similar operation as operation 120. The gate contacts 262 can be formed on respective sidewalls of the dielectric spacer 240 to directly contact the gate electrode 230.

Figure 16:
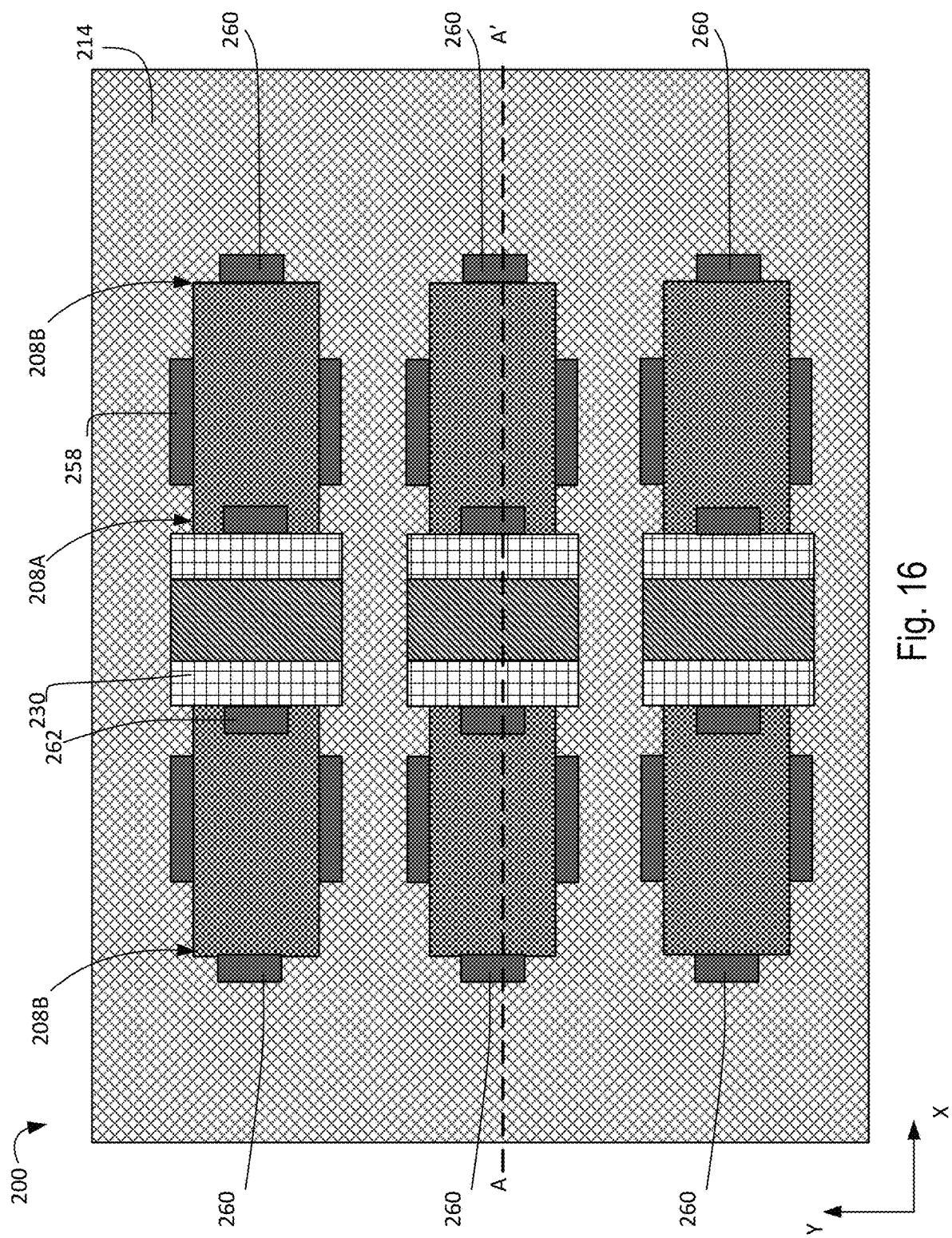

FIG. 16 is a top view of the semiconductor device 200 corresponding to FIG. 15 in which the source/drain contacts 260 and the gate contacts 262 are formed, in accordance with various embodiments. The formation of the source/drain contacts 260 at the second end portion 208B of the respective semiconductor layer 208 (i.e., the source/drain regions 246, 258) provides additional connection options for the semiconductor device 200 for improved device performance and design flexibility. The embodiment of FIG. 15 can be a cross sectional view of the semiconductor device 200 along the line AA' indicated in FIG. 16.

Figure 17:
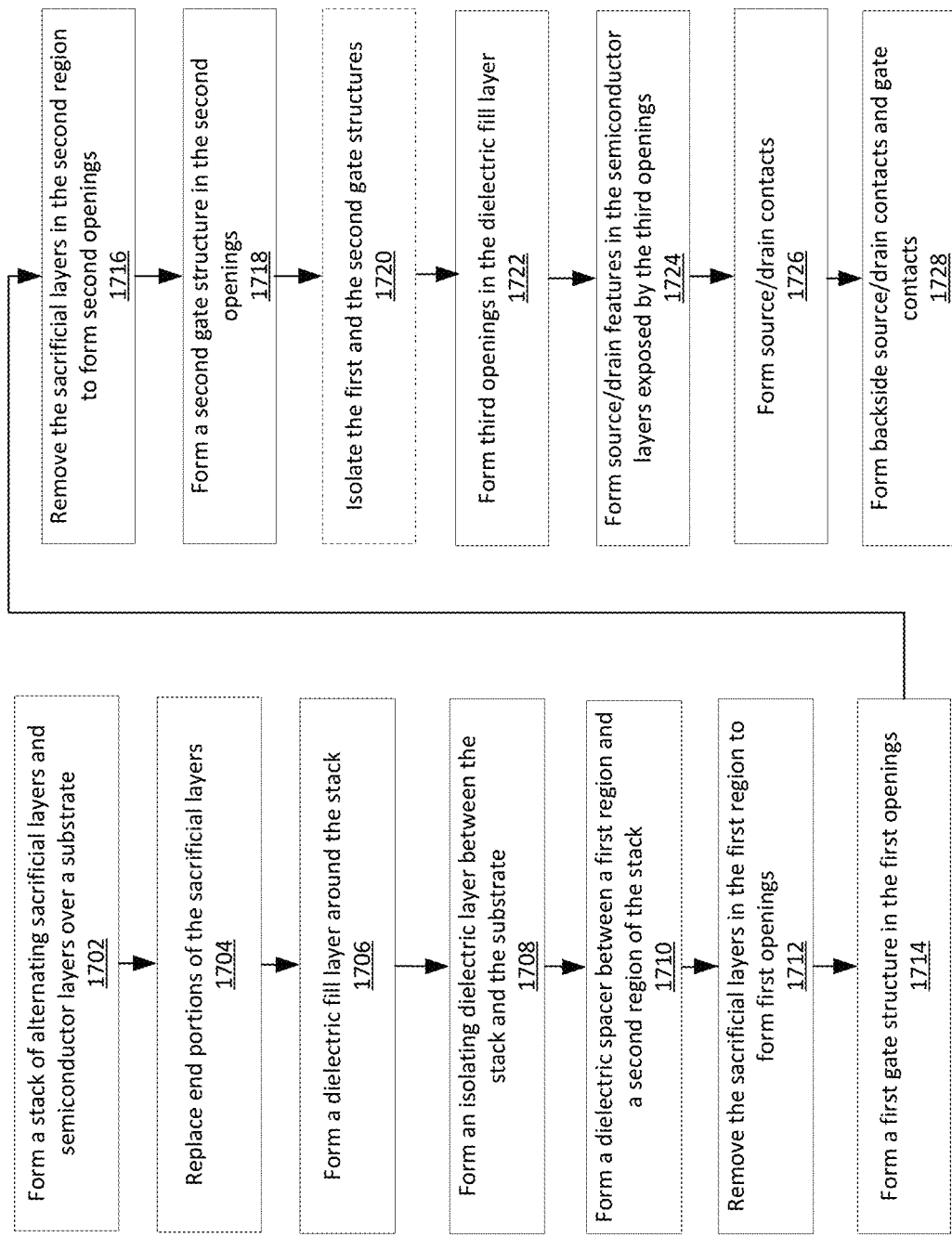
FIG. 17 is a flow chart of a method for making a semiconductor device, in accordance with some embodiments.

FIG. 17 illustrates a flow chart of a method 1700 for making a complementary transistor pair, based on the vertical stack structure of the semiconductor device 200. For example, the vertical stack structure can be formed from a plurality of nanosheets (e.g., the semiconductor layers 208). The vertical stack structure can include two columns of channels, without an electrical connection therebetween. In some embodiments, the two columns of transistors can be connected by an additional operation, such as along a surface of the semiconductor device 200. In some embodiments, respective transistors can be electrically disconnected or isolated (e.g., can be independently operated in separate circuits). It is noted that the method 1700 is merely an example, and is not intended to limit the present disclosure. Accordingly, it is understood that additional operations may be provided before, during, and after the method 1700 of FIG. 17, and that some other operations may only be briefly described herein.

In various embodiments, operations of the method 1700 may be associated with cross-sectional views and top views of the example semiconductor device 200 at various fabrication stages as shown in FIGS. 18 to 32, which will be discussed in further detail below. It should be understood that the semiconductor device 200, shown in FIGS. 18 to 32, may include a number of other devices such as inductors, fuses, capacitors, coils, etc., while remaining within the scope of the present disclosure.

In brief overview, the method 1700 starts with operation 1702 of forming a stack of alternating sacrificial layers and semiconductor layers over a substrate. The method 1700 continues to operation 1704 of replacing end portions of the sacrificial layers with dielectric layers by an indent etch process, for example. The method 1700 continues to operation 1706 of forming a dielectric fill layer around the stack. The method 1700 proceeds to operation 1708 of forming an isolating dielectric layer between the stack and the substrate. The method 1700 proceeds to operation 1710 of forming a dielectric spacer separating the stack into a first device region and a second device region. The method 1700 proceeds to operation 1712 of removing the sacrificial layers in the first device region to form first openings. The method 1700 proceeds to operation 1714 of forming a first gate structure in the first device openings. The method 1700 proceeds to operation 1716 of removing the sacrificial layers in the second device region to form second openings. The method 1700 proceeds to operation 1718 of forming a second device gate structure in the second openings. The method 1700 proceeds to operation 1720 of optionally separating the gate structure into a first portion and a second portion in the first device region and the second device region, respectively. The method 1700 proceeds to operation 1722 of forming third openings in the dielectric fill layer. At operation 1724, source/drain features are formed in portions of the semiconductor layers exposed in the third openings. At operation 1726, source/drain contacts are formed connect to the source/drain regions. At operation 1728, additional electrodes (or contacts) are formed to connect to the gate structure and the source/drain regions.

Various operations depicted in FIG. 17 may be similar to other operations depicted in this disclosure. For example, in various embodiments, the operations 1702, 1704, 1706, 1708, and 1722-1728 may be performed in a fashion as has previously been described with regard to operations 102, 104, 106, 108, and 116-122, respectively, as depicted in FIG. 1.

Figure 18:
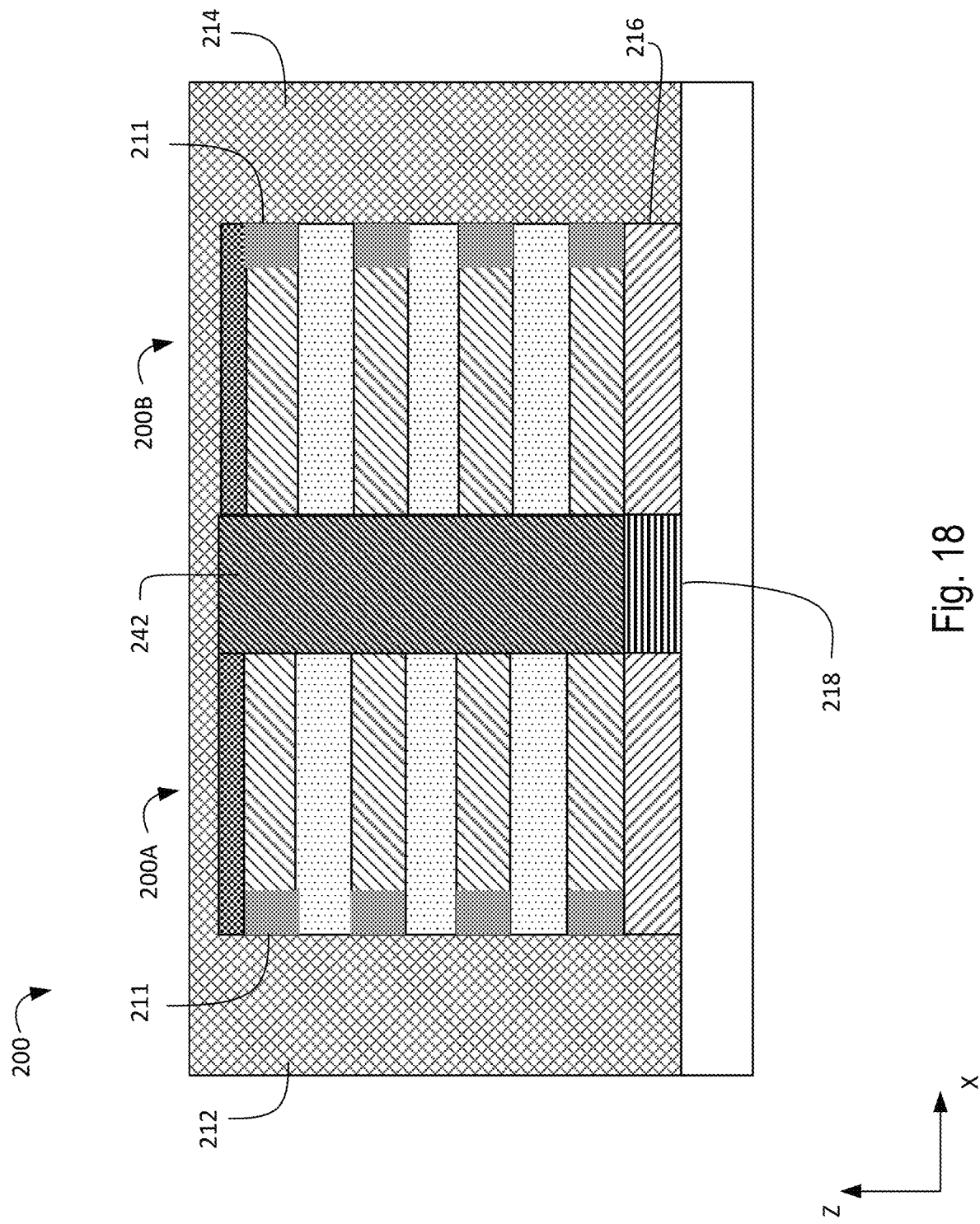
FIGS. 18, 19, 20, 21, 22, 23, 24, 25, 26, 27, 29, and 30 each illustrate a cross sectional view of a semiconductor device during various fabrication stages, made by the method of FIG. 17, in accordance with some embodiments.

Corresponding to operation 1710 of FIG. 13, FIG. 18 is a cross sectional view of the semiconductor device 200 in which a dielectric spacer 242 is formed over the center isolating dielectric 218 in the cavity 224, in accordance with various embodiments. The dielectric spacer 242 is similar to the dielectric spacer 240 and can be formed by filling the cavity 224 with a dielectric material performing a planarization process. The dielectric fill layer can be subsequently formed over the dielectric spacer 242 and subsequently planarized to overlay the cap layer 210 and connect the dielectric structures 212, 214. The dielectric spacer 242 thus separates the stack of nanosheets, i.e., the semiconductor layers 208 and the sacrificial material layers 206, into a first device region 200A and a second device region 200B. In some embodiments, the device regions 200A and 200B are configured to provide transistors (e.g., field-effect transistors, or FETs) of different conductivity types, e.g., a pair of complementary FETs or CFETs.

Figure 19:
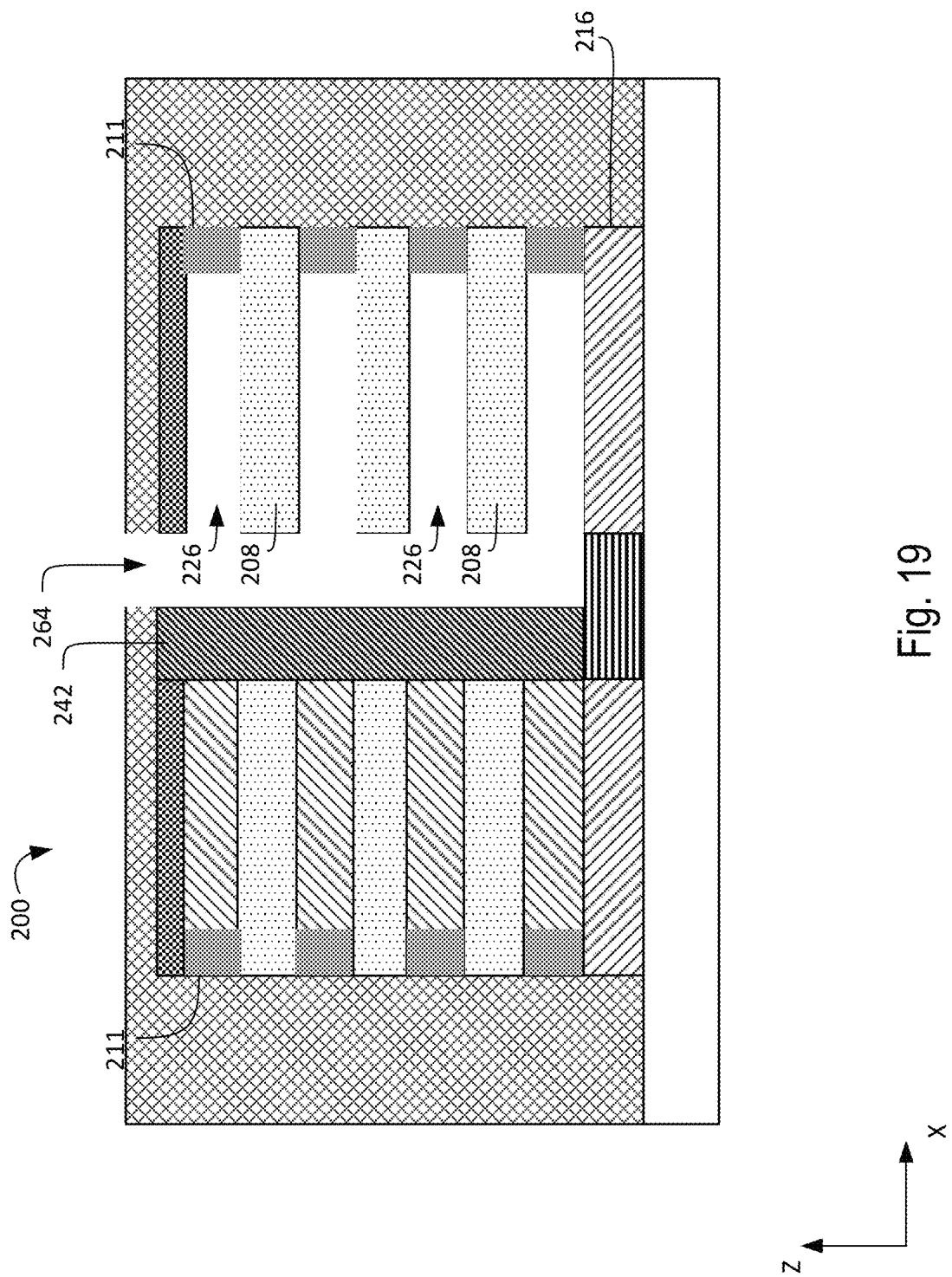

Corresponding to operation 1712 of FIG. 17, FIG. 19 is a cross sectional view of the semiconductor device 200 in which a portion of the dielectric spacer 242 in the second device region 200B is removed, in accordance with various embodiments. The dielectric spacer 242 can be masked and etched to the substrate 202 or the center isolating dielectric 218. A portion of the dielectric spacer 242 in the first device region 200A is protected by the mask during etching and remains in the semiconductor device 200. The etching of the dielectric spacer 242 forms a cavity 264 that exposes the sacrificial material layers 206 to further etching.

With furtherance to FIG. 19, the sacrificial material layers 206 in the second device region 200B are removed to form the openings 226 between the semiconductor layers 208 having the channel regions 236. The sacrificial material layers 206 can be selectively etched and removed according to the disclosure provided with regard to operation 110. For example, an etchant configured to react with the material (e.g., SiGe) of the sacrificial material layers 206 can be introduced through the cavity 226 to remove the sacrificial material layers 206 without removing, or substantially removing, the semiconductor layers 208.

Figure 20:
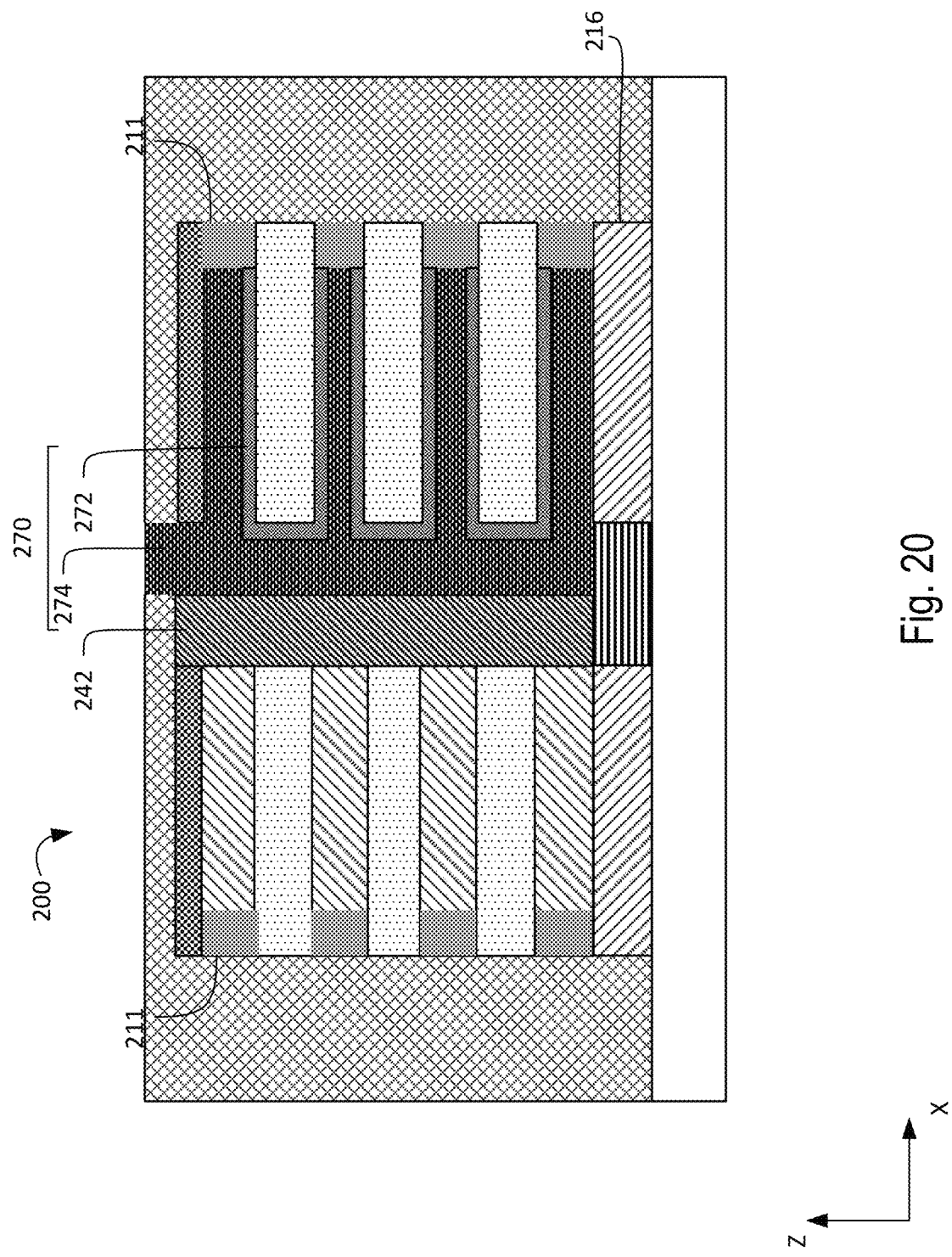

Corresponding to operation 1714 of FIG. 17, FIG. 20 is a cross sectional view of the semiconductor device 200 in which a gate structure 270 including a gate dielectric 272 and a gate electrode 274 over the gate dielectric 272 is formed in the cavity 264 and the openings 226, in accordance with various embodiments. The gate dielectric 272 and the gate electrode 274 can be formed over the channel region 236 of the respective semiconductor layer 208 in a fashion similar to that described above with respect to the gate dielectric 228 and the gate electrode 230. In some embodiments, the gate dielectric 272 and the gate electrode 274 are configured to form a p-type metal-oxide-semiconductor (PMOS) transistor. For example, the gate dielectric 272 and/or the gate electrode 274 can include materials configured to provide a gate structure having a threshold voltage suitable for a PMOS transistor. The description of the gate dielectric 272 and the gate electrode 274 being configured to form a PMOS gate structure is not intended to be limiting. For example, the gate structure 270 formed at operation 1716 can be of n-type and configured for an NMOS transistor.

Figure 21:
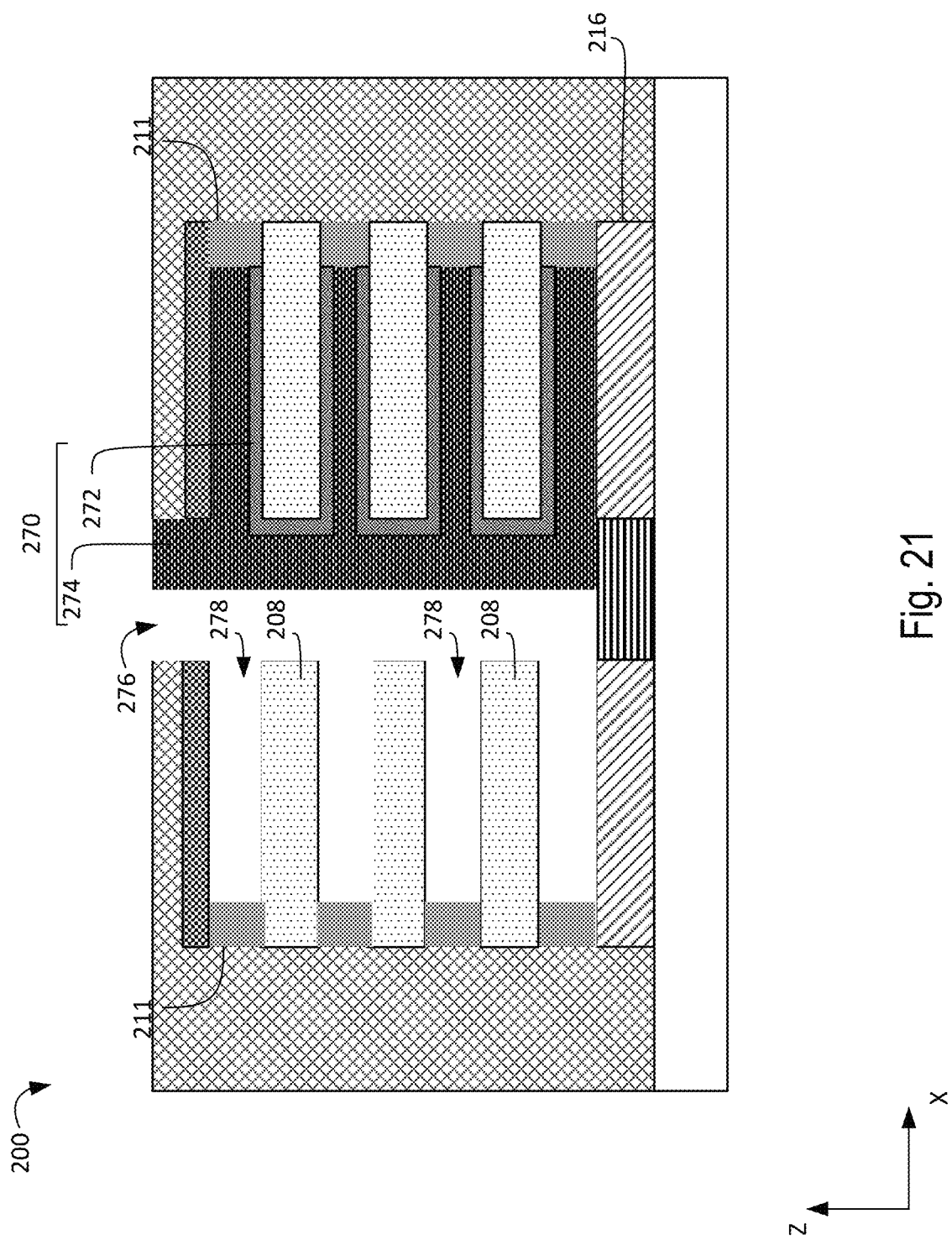

Corresponding to operation 1716 of FIG. 17, FIG. 21 is a cross sectional view of the semiconductor device 200 in which the remaining portion of the dielectric spacer 242 in the first device region 200A is removed, in accordance with various embodiments. The dielectric spacer 242 can be masked and etched to the substrate 202 or the center isolating dielectric 218. The gate structure 270 in the second device region 200B is protected by the mask during etching and remains in the semiconductor device 200. The etching of the dielectric spacer 242 forms a cavity 276 that exposes the sacrificial material layers 206 to further etching.

With furtherance to FIG. 21, the sacrificial material layers 206 in the first device region 200A are removed to form the openings 278 between the semiconductor layers 208. The sacrificial material layers 206 can be selectively etched and removed according to the disclosure provided with regard to operation 110.

Figure 22:
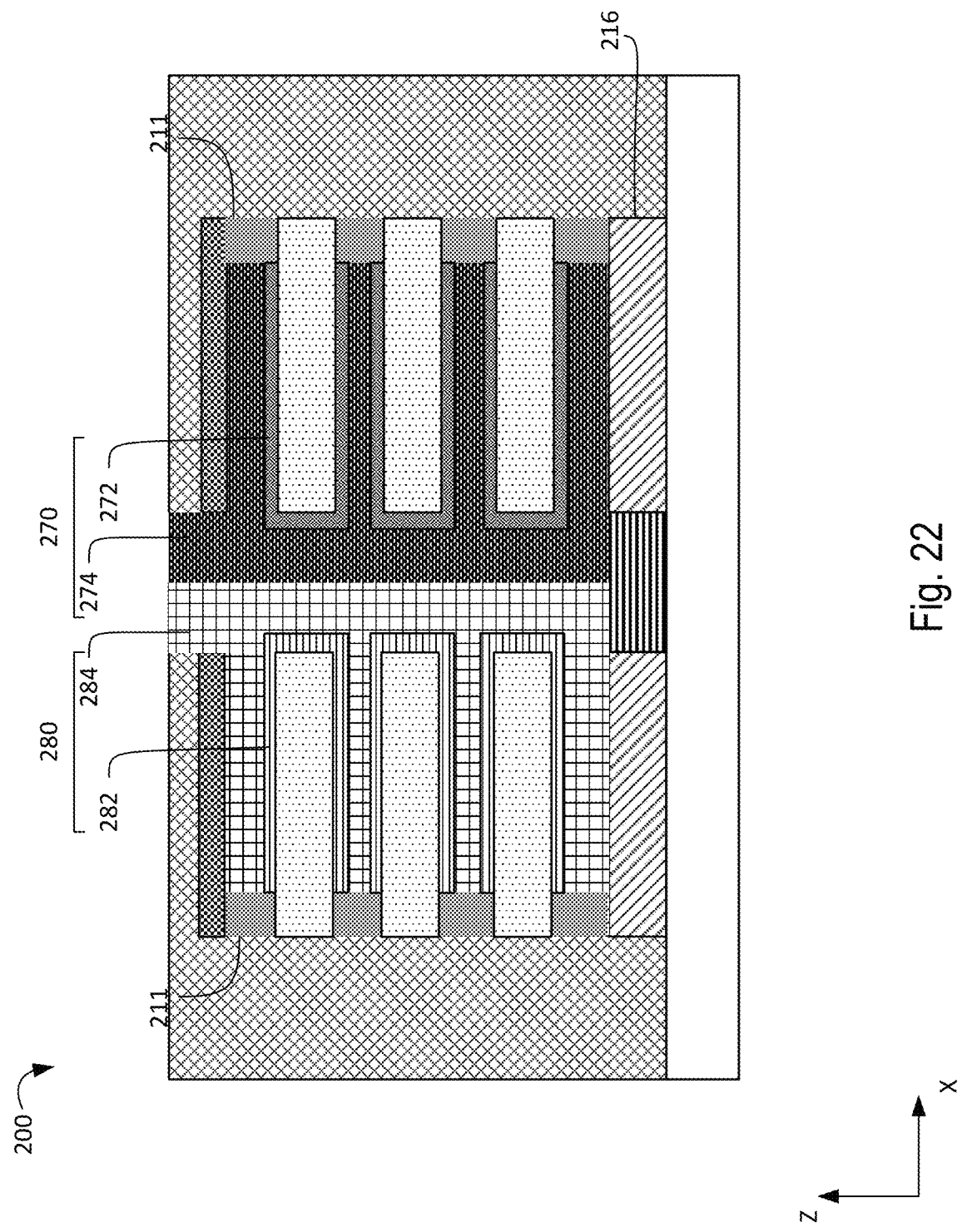

Corresponding to operation 1718 of FIG. 17, FIG. 22 is a cross sectional view of the semiconductor device 200 in which a gate structure 280 including a gate dielectric 282 and a gate electrode 284 over the gate dielectric 282 is formed in the cavity 276 and the openings 278, in accordance with various embodiments. The gate dielectric 282 and the gate electrode 284 can be formed over the channel region 236 of the respective semiconductor layer 208 in a fashion similar to that described above with respect to the gate dielectric 228 and the gate electrode 230. In some embodiments, the gate structure 280 is configured to provide a transistor having a conductivity type different from that provided by the gate structure 270. For example, if the gate structure 270 is configured to form a PMOS transistor, then the gate structure 280 is configured to form an NMOS transistor. In this regard, composition of the gate dielectric 282 can differ from that of the gate dielectric 272 and composition of the gate electrode 284 can differ from that of the gate electrode 274. Accordingly, the description of the gate structure 280 being configured to form a NMOS gate structure is not intended to be limiting but depends from the configuration of the gate structure 270. As shown, each of the gate structure 270 and the gate structure 280 includes a vertical portion that continuously extends toward the center isolating dielectric 218 and multiple horizontal portions connected to the vertical portion and interleaved with the semiconductor layers 208 (e.g., the channel regions 236), resulting in a fork-like structure. In some embodiments, the gate structure 270 and the gate structure 280 are configured to form transistors of the same conductivity type, similar to the embodiment depicted in FIG. 9.

Figure 23:
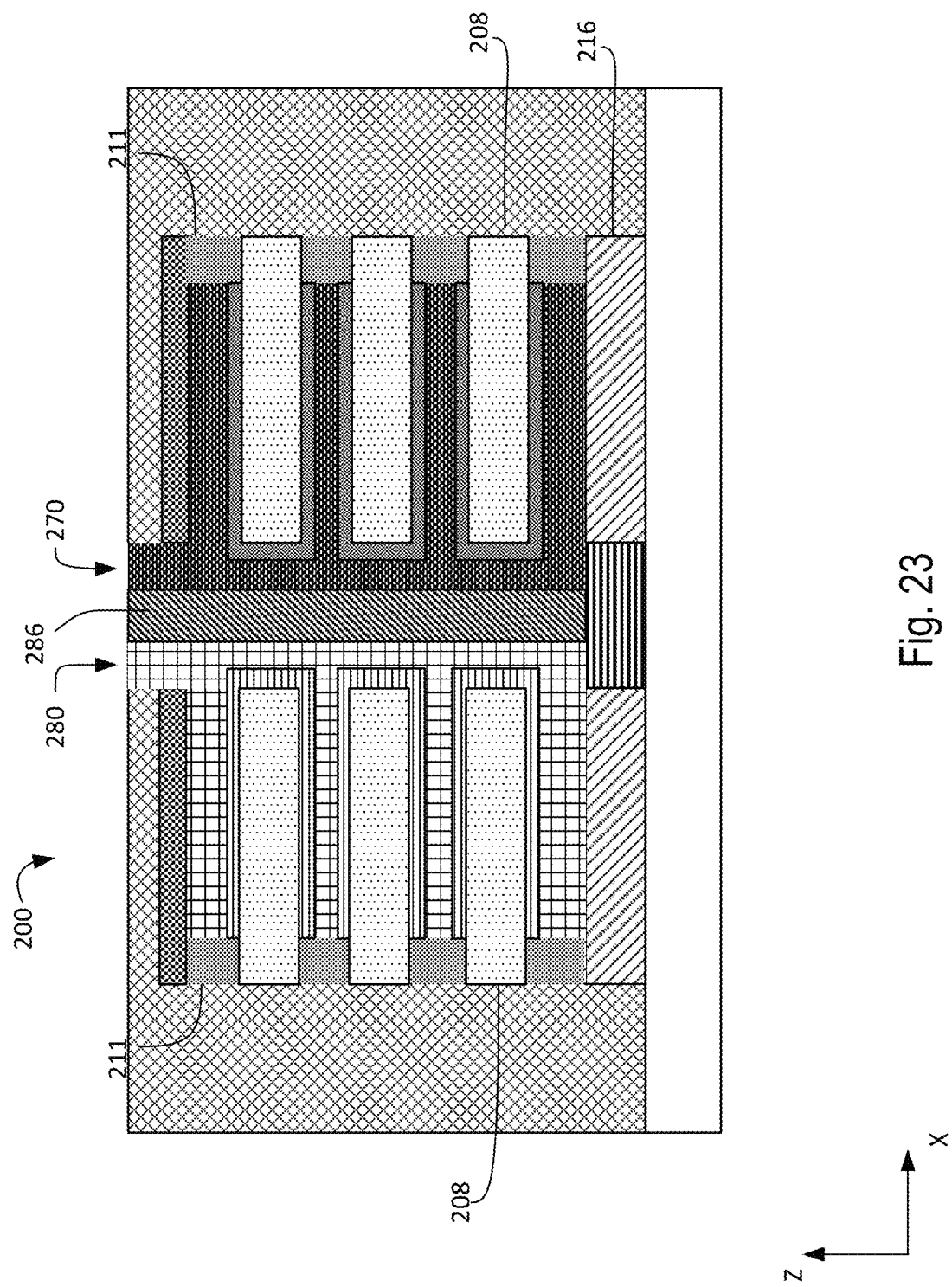

Corresponding to operation 1720 of FIG. 17, FIG. 23 is a cross sectional view of the semiconductor device 200 in which a dielectric spacer 286 is formed between the gate structure 270 and the gate structure 280, in accordance with various embodiments. The dielectric spacer 286 is similar to the dielectric spacer 240 and can be formed according to an operation similar to operation 114. For example, portions of the gate structure 270 and the gate structure 280 between the two stacks of the semiconductor layers 208 (e.g., the channel regions 236) can be masked and etched to form a cavity (not depicted), thereafter filled with the dielectric, and planarized along the upper surface of the semiconductor device 200. Accordingly, the gate structure 270 and the gate structure 280, which can be configured to form transistors of different conductivity types, are laterally separated by the dielectric spacer 286. In other words, the transistor formed in the first device region 200A and the transistor formed in the second device region 200B are electrically isolated by the dielectric spacer 286.

In some embodiments, such as the embodiment depicted in FIGS. 24-27, the dielectric spacer 242 described above with respect to operation 1710 is partially replaced by portions of the gate structure 270 and the gate structure 280, such that a portion of the dielectric spacer 242 laterally separates the gate structure 270 and the gate structure 280. In this regard, operation 1720 described above can be omitted.

Figure 24:
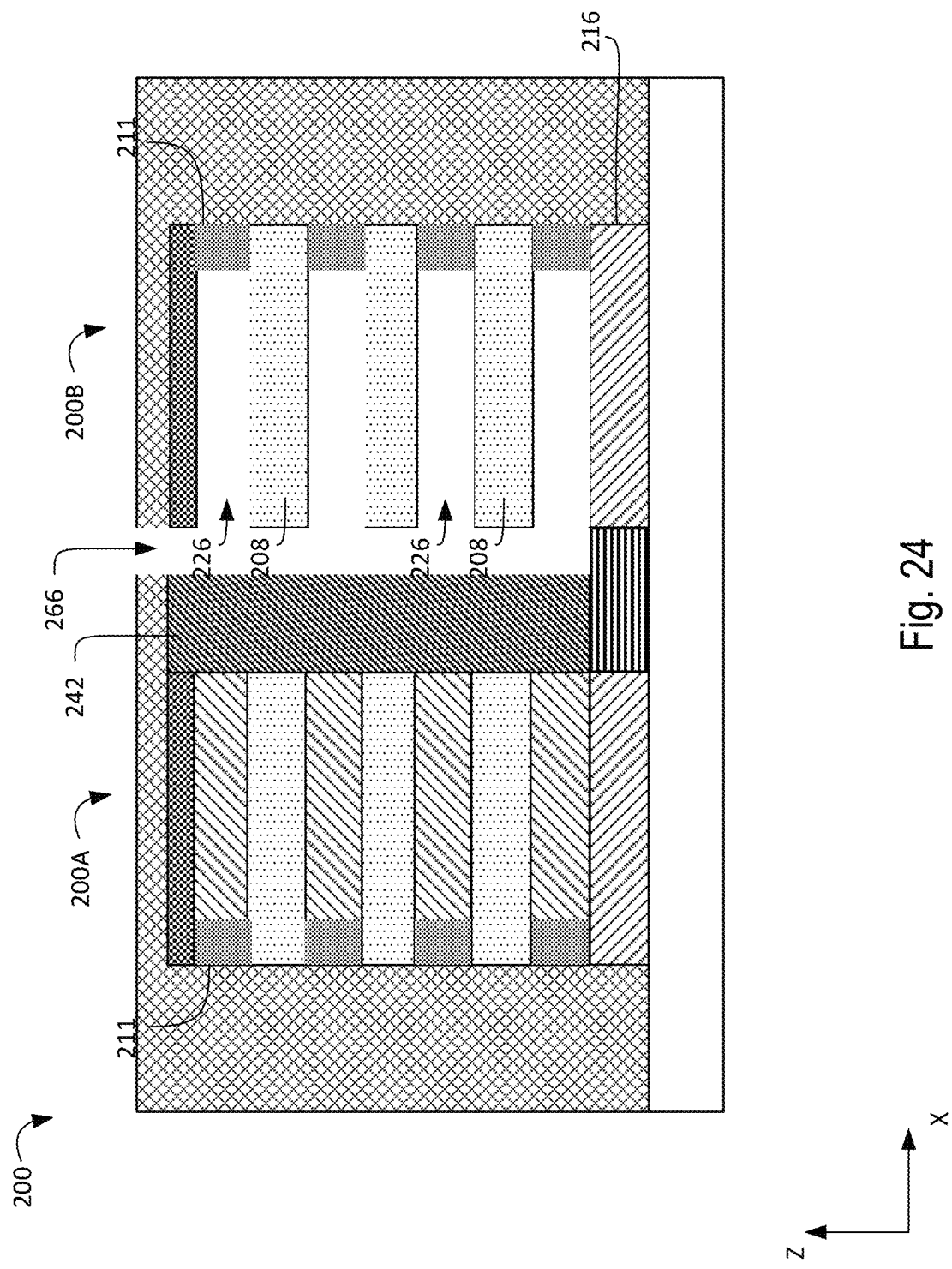

For example, corresponding to operation 1712 of FIG. 17, FIG. 24 is a cross sectional view of the semiconductor device 200 in which a portion of the dielectric spacer 242 in the second device region 200B is removed, similar to the description above with respect to FIG. 19. The etching of the dielectric spacer 242 forms a cavity 266 that exposes the sacrificial material layers 206, where the cavity 266 may be a narrower opening along the X-axis than the cavity 264 as depicted in FIG. 19. With furtherance to FIG. 24, the openings 226 are formed in the second device region 200B according to the process described above with respect to FIG. 19.

Figure 25:
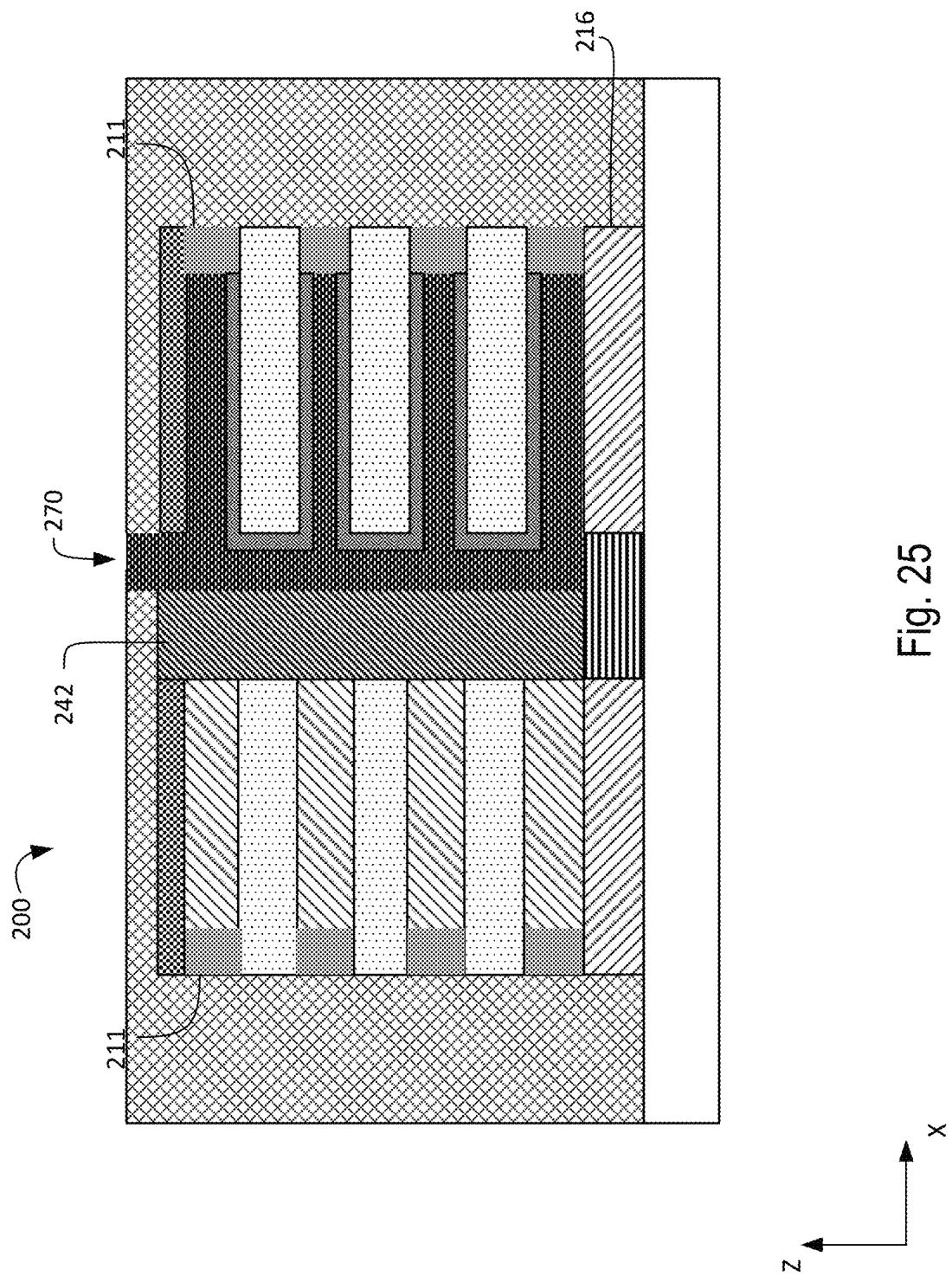

Corresponding to operation 1714 of FIG. 17, FIG. 25 is a cross sectional view of the semiconductor device 200 in which the gate structure 270 including the gate dielectric 272 and the gate electrode 274 over the gate dielectric 272 is formed in the cavity 266 and the openings 226 according to the process described above with respect to FIG. 20.

Figure 26:
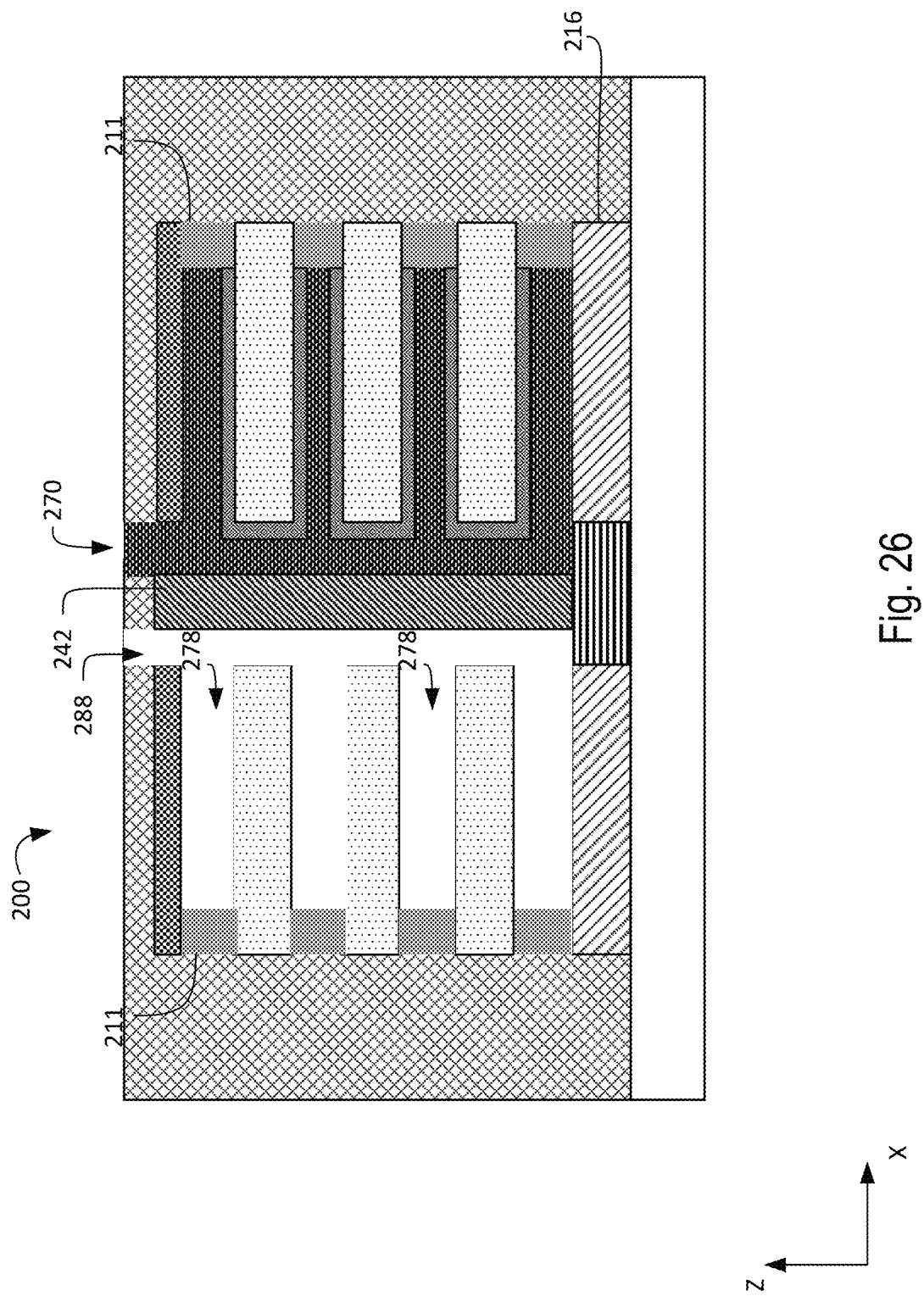

Corresponding to operation 1716 of FIG. 17, FIG. 26 is a cross sectional view of the semiconductor device 200 in which a portion of the dielectric spacer 242 in the first device region 200A is removed to form a cavity 288, similar to the description above with respect to FIG. 21. However, different from the embodiment depicted in FIG. 21, the cavity 288 is formed adjacent to a remaining portion of the dielectric spacer 242, rather than the gate electrode 274. In this regard, a portion of the dielectric spacer 242 is protected by the mask during the etching process, resulting in the cavity 288. With furtherance to FIG. 26, the openings 278 are formed in the first device region 200A according to the process described above with respect to FIG. 21.

Figure 27:
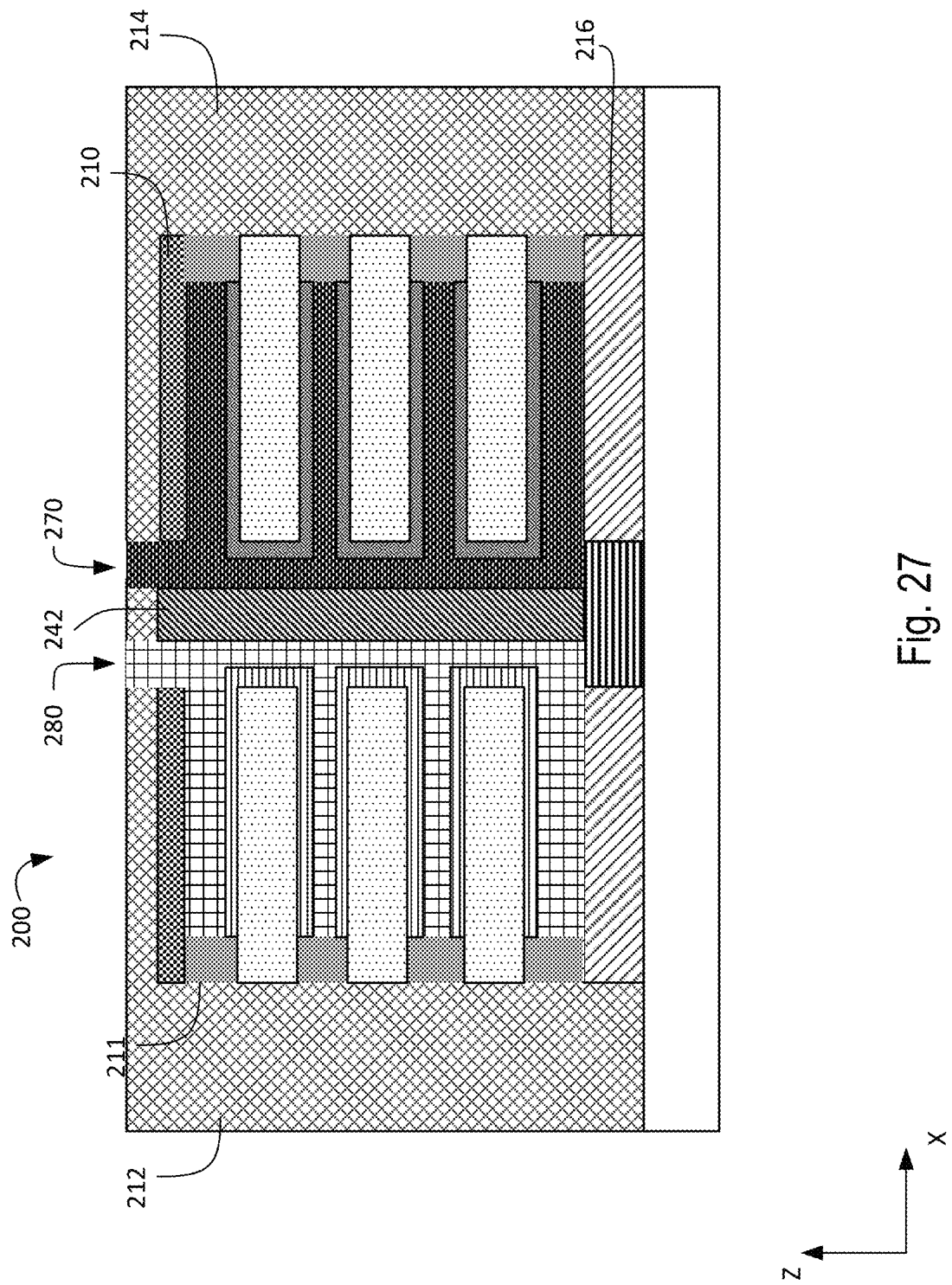

Corresponding to operation 1718 of FIG. 17, FIG. 27 is a cross sectional view of the semiconductor device 200 in which the gate structure 280 including the gate dielectric 282 and the gate electrode 284 over the gate dielectric 282 is formed in the cavity 288 and the openings 278 according to the process described above with respect to FIG. 22.

Accordingly, the embodiment depicted in FIG. 27 is similar, though not identical, to that depicted in FIG. 23 in that the gate structure 270 and the gate structure 280, which are configured to form transistors of different conductivity types, are laterally separated by a dielectric spacer. For example, comparing FIG. 27 with FIG. 23, the dielectric spacer 242 stops at an upper surface of the cap layer 210, whereas the dielectric spacer 286 extends through the dielectric fill layer that overlays the stacks of nanosheets.

Figure 28:
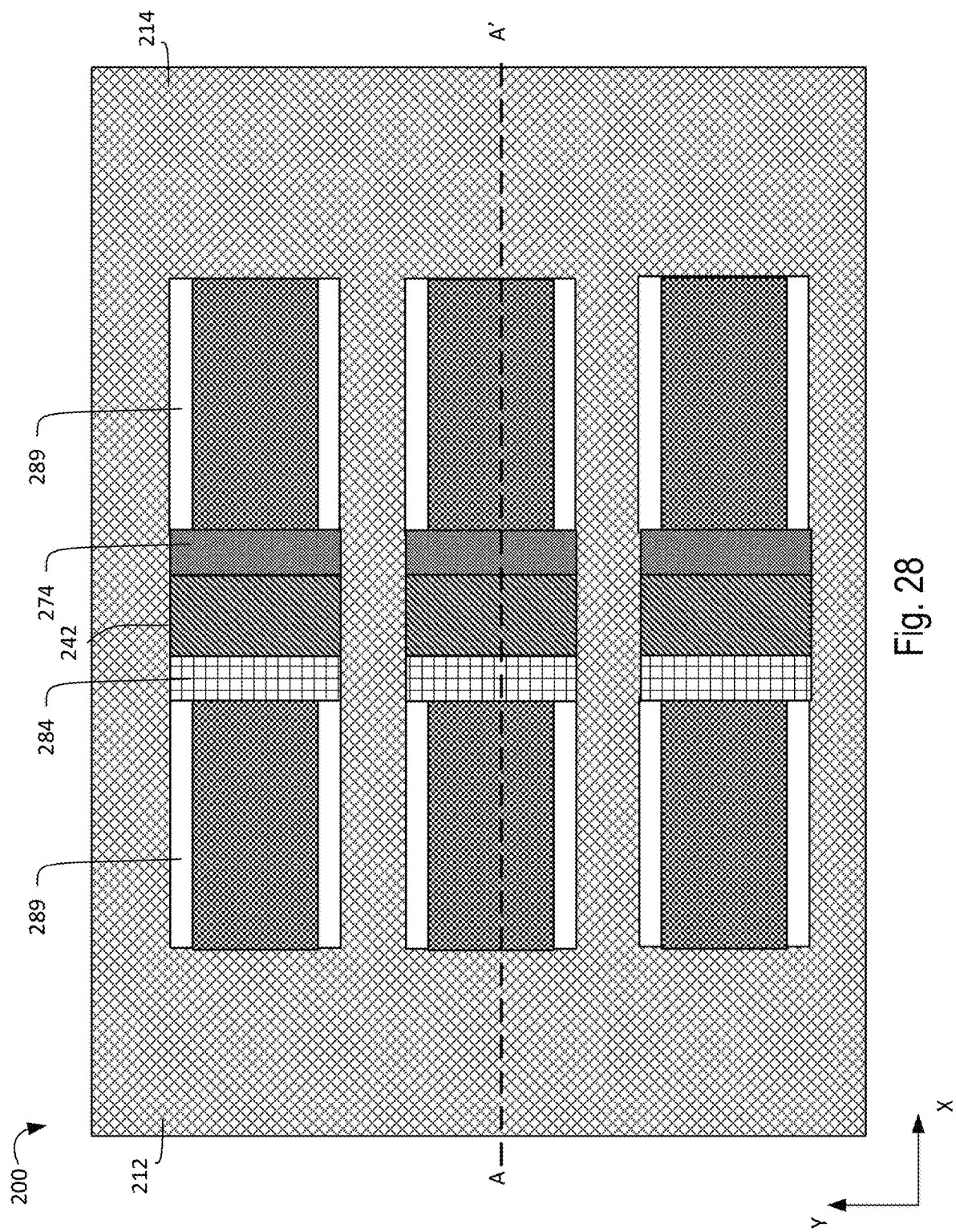
FIGS. 28, 31, and 32 each illustrate a top view of a semiconductor device during various fabrication stages, made by the method of FIG. 17, in accordance with some embodiments.

Using the embodiment of FIG. 23 as an example and continuing with operation 1722 of FIG. 17, FIG. 28 is a top view of the semiconductor device 200 in which openings 289 are formed, in accordance with various embodiments. As shown, the openings 289 are formed in the semiconductor device 200 by directionally etching the surface of the semiconductor device 200 toward the substrate 202 according to an operation similar to operation 122.

Figure 29:
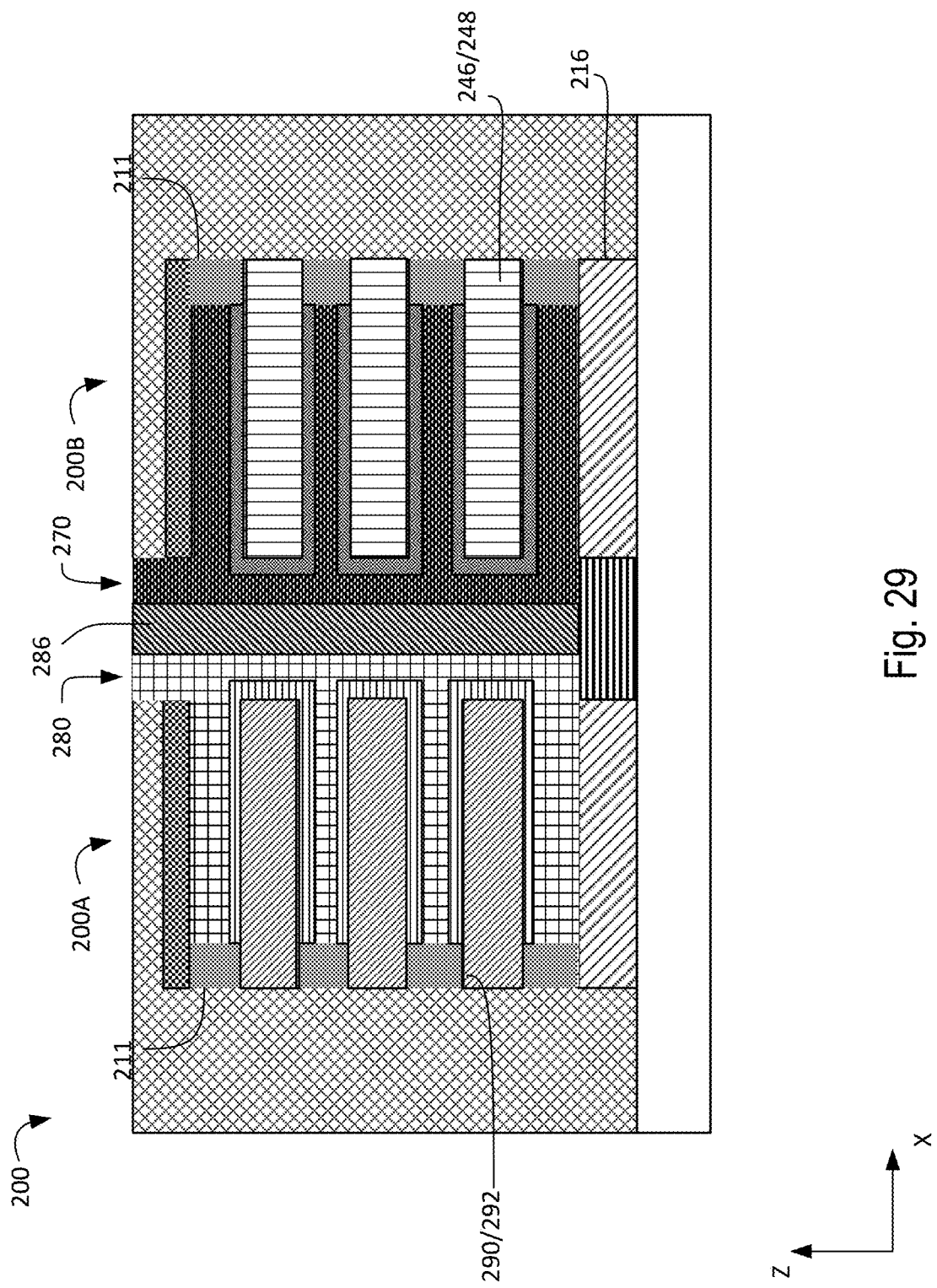

Corresponding to operation 1724 of FIG. 17, FIG. 29 is a cross sectional view of the semiconductor device 200 in which the source/drain regions in the device regions 200A and 200B are prepared for connection, in accordance with various embodiments. As shown, the source/drain regions 246, 248 are engaged with the gate structure 270 in the second device region 200B to form a first transistor (e.g., a PMOS transistor), while source/drain regions 290, 292 are engaged with the gate structure 280 in the first device region 200A to form a second transistor (e.g., an NMOS transistor). In some embodiments, the source/drain regions 246, 248 and the source/drain regions 290, 292 are configured to form transistors of different conductivity types. Preparing the source/drain regions for connection can include doping or otherwise treating/activating the source/drain regions 246, 248 and 290, 292 for connection to a source or drain electrode according to an operation similar to operation 118. In some examples, the source/drain regions 246, 248 and 290, 292 can be doped, similar to the embodiment depicted in FIG. 11. In some examples (not depicted), additional semiconductor materials can be epitaxially grown over, and thereby merging, the source/drain regions 246, 248 and 290, 292, similar to the embodiment depicted in FIG. 12.

Figure 30:
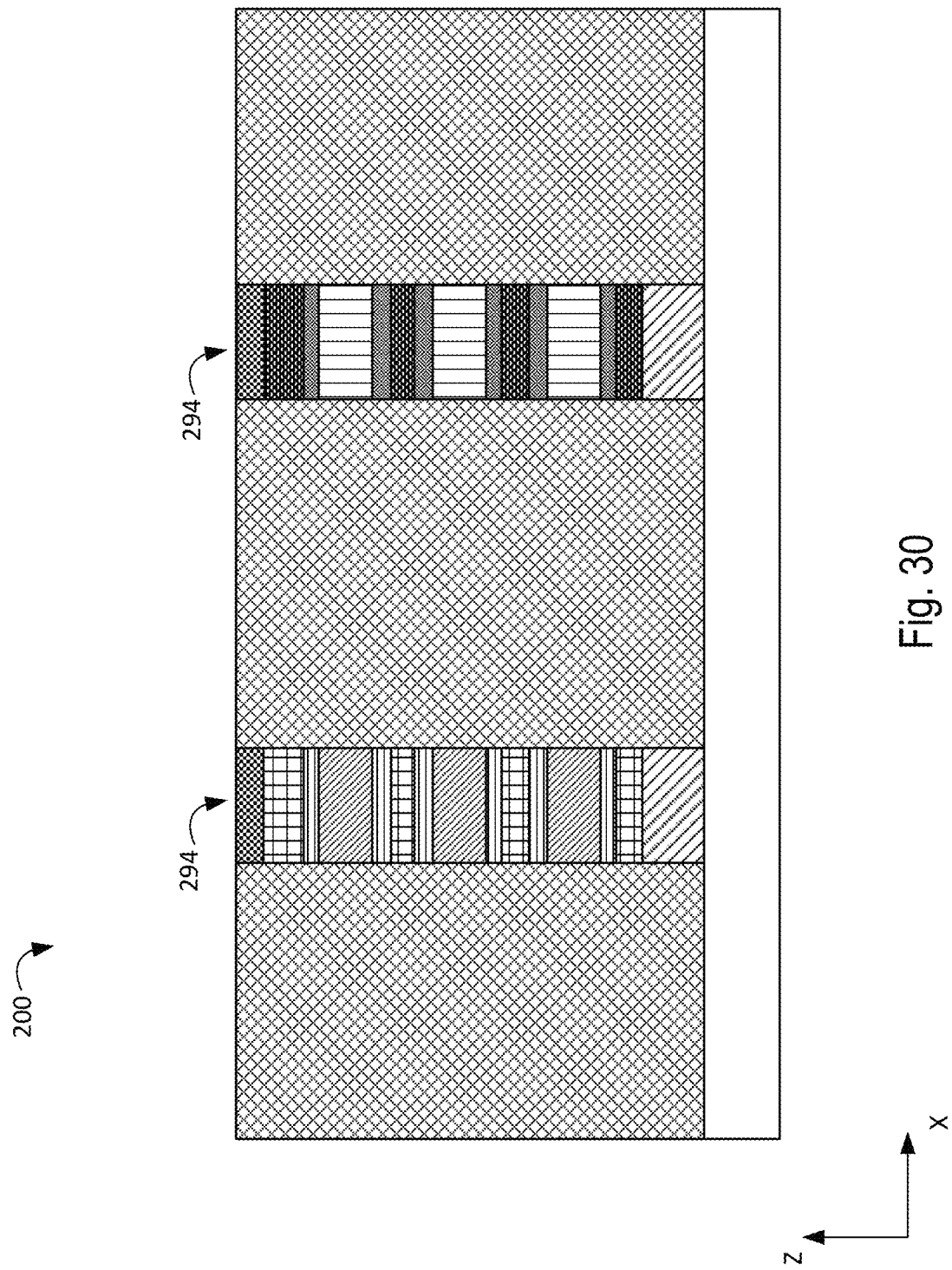
Figure 31:
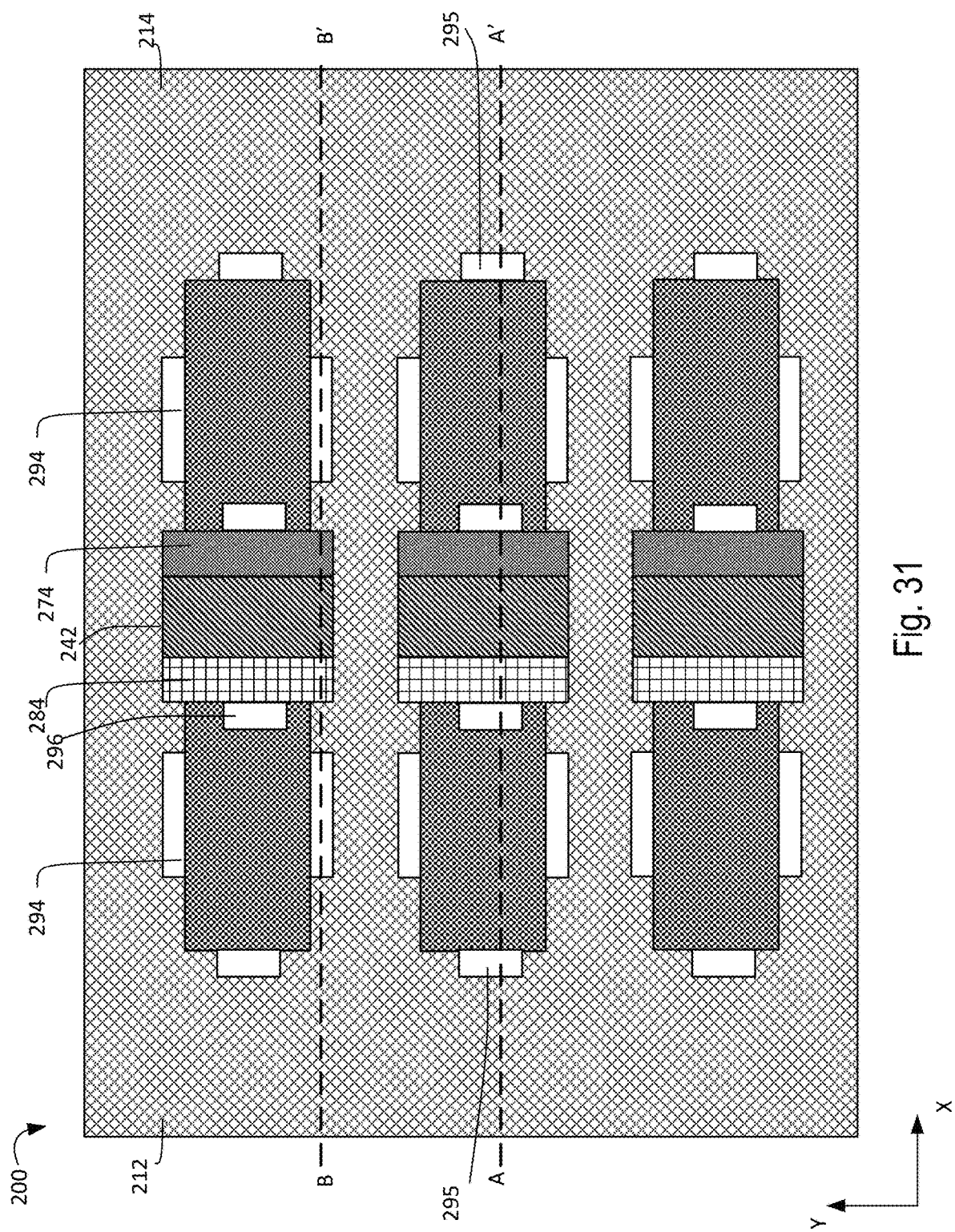

Corresponding to operation 1726 of FIG. 17, FIG. 30 is a cross sectional view of the semiconductor device 200 in which electrode openings 294 are formed to receive the source/drain contacts 258. FIG. 31 is a top view of the semiconductor device 200, where a cross sectional view along the line AA' corresponds to the embodiment depicted in FIG. 29 and a cross sectional view along line BB' corresponds to the embodiment depicted in FIG. 30. Additional electrode openings 295 and 296 configured to receive the source/drain contacts 260 and the gate contacts 262, respectively, can be formed by patterning the dielectric fill layer (e.g., the dielectric structures 212, 214) according to the process of operation 104. Additional electrode openings can be formed according to various design requirements.

Figure 32:
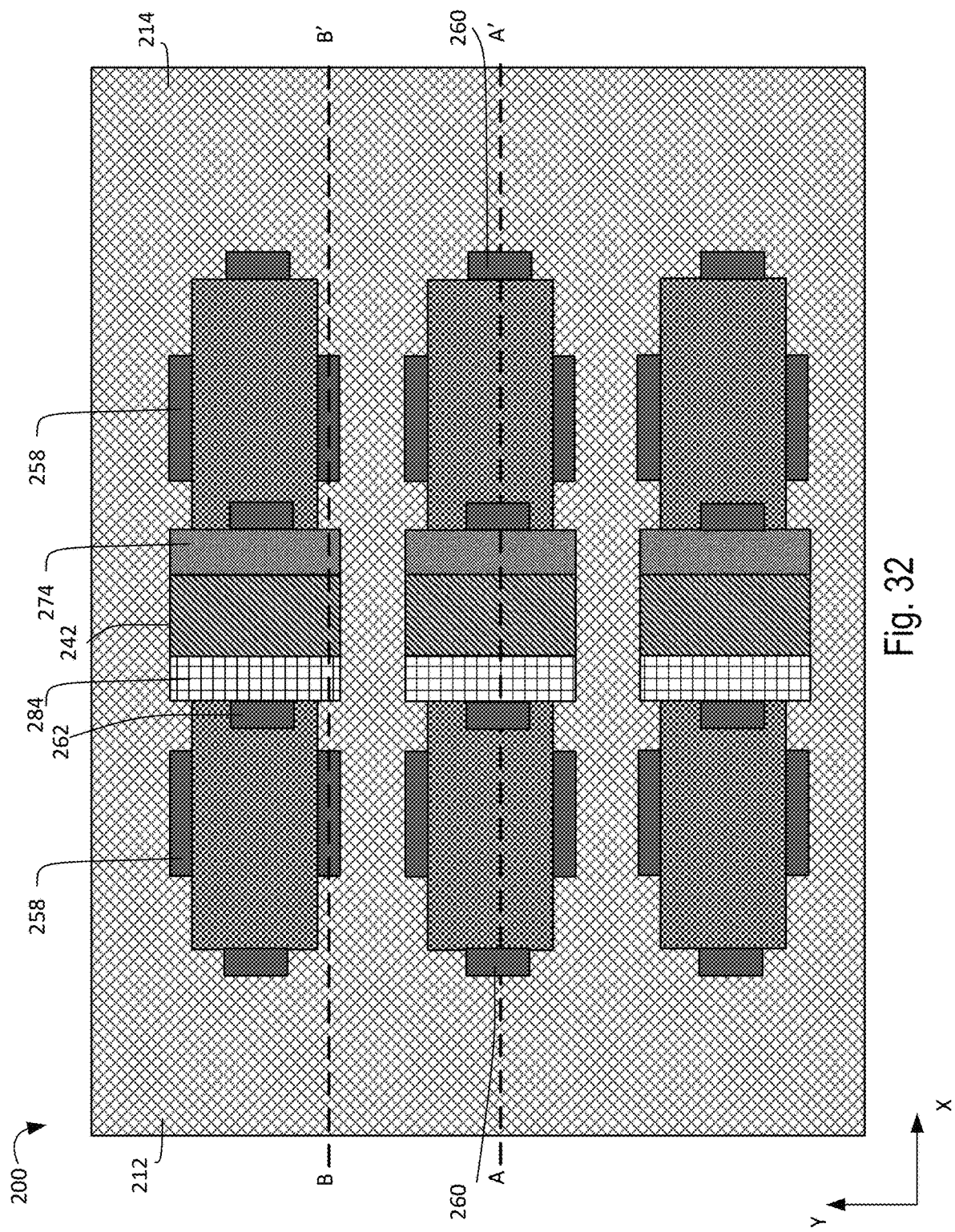

Corresponding to operation 1728 of FIG. 17, FIG. 32 is a top view of the semiconductor device 200 in which the source/drain contacts 258, the source/drain contacts (e.g., configured to supply the back biases) 260, and the gate contacts 262, in accordance with various embodiments. The source/drain contacts 258, the source/drain contacts 260, and the gate contacts 262 can be formed in the electrode openings 294, 295, and 296, respectively, by depositing a metal in the electrode openings and planarizing the metal to form the electrodes, according to an operation similar to operation 120.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A semiconductor structure, comprising:
a plurality of semiconductor layers stacked vertically over a substrate;
a gate structure interleaved with the plurality of semiconductor layers, wherein the gate structure wraps around a first end portion of each of the plurality of semiconductor layers;
dielectric layers stacked vertically over the substrate and interleaved with the semiconductor layers, wherein a first end portion of each dielectric layer is aligned with a second end portion of each of the semiconductor layers laterally opposite to the first end portion of each of the plurality of semiconductor layers; and
a metal contact extending vertically to contact the second end portion of each of the plurality of semiconductor layers,
wherein the metal contact directly contacts the first end portion of each of the dielectric layers.

2. The semiconductor structure of claim 1, wherein the metal contact is a first metal contact, the semiconductor structure further comprising a second metal contact electrically coupled to a center portion of each of the plurality of semiconductor layers between the first end portion and the second end portion.

3. The semiconductor structure of claim 1, wherein a second end portion of each of the dielectric layers opposite the first end portion of each of the plurality of semiconductor layers directly contacts the gate structure.

4. The semiconductor structure of claim 1, wherein each semiconductor layer includes a channel region interposed between a pair of source/drain regions, and wherein each source/drain region extends laterally from the first end portion to the second end portion.

5. The semiconductor structure of claim 1, wherein the metal contact is coupled to a source/drain region of the semiconductor layer.

6. The semiconductor structure of claim 1, further comprising a dielectric structure adjacent the gate structure, the dielectric structure extending vertically over the first end portion of each of the plurality of semiconductor layers.

7. The semiconductor structure of claim 1, further comprising an isolation layer between a bottommost one of the plurality of semiconductor layers and the substrate, wherein the isolation layer extends laterally to contact a bottommost one of the dielectric layers.

8. The semiconductor structure of claim 1, wherein the metal contact is a first metal contact, the semiconductor structure further comprising a second metal contact electrically coupled to a portion of the gate structure over the first end portion of the semiconductor layer.

9. A semiconductor structure, comprising:
first semiconductor layers stacked vertically over a substrate;
second semiconductor layers stacked vertically over the substrate and adjacent the first semiconductor layers;
a first gate structure interleaved with the first semiconductor layers, wherein the first gate structure wraps around a first end portion of each of the first semiconductor layers;
a second gate structure interleaved with the second semiconductor layers, wherein the second gate structure wraps around a first end portion of each of the second semiconductor layers;
dielectric layers stacked vertically over the substrate and interleaved with the first semiconductor layers and the second semiconductor layers, respectively, wherein a sidewall of each dielectric layer is aligned with a second end portion of each of the first semiconductor layers and a second end portion of each of the second semiconductor layers, respectively, the second end portion being laterally opposite to the first end portion of each of the first semiconductor layers and the second semiconductor layers;
a first metal contact extending vertically to contact the second end portion of each of the first semiconductor layers; and
a second metal contact extending vertically to contact the second end portion of each of the second semiconductor layers,
wherein the first gate structure includes a first gate dielectric layer and the second gate structure includes a second gate dielectric layer, the first gate dielectric layer being different from the second gate dielectric layer in composition.

10. The semiconductor structure of claim 9, wherein the first gate structure and the second gate structure are electrically coupled to one another.

11. The semiconductor structure of claim 9, further comprising an isolation structure to electrically isolate the first gate structure from the second gate structure.

12. The semiconductor structure of claim 11, wherein the first gate structure and the second gate structure are configured to provide devices of different conductivity types.

13. The semiconductor structure of claim 11, wherein the first gate structure and the second gate structure are configured to provide devices of the same conductivity type.

14. The semiconductor structure of claim 11, wherein the isolation structure is a first isolation structure, the semiconductor structure further comprising a second isolation structure over the substrate and below both a bottommost one of the first semiconductor layers and a bottommost one of the second semiconductor layers, and wherein the second isolation structure extends laterally to contact the bottommost one of the dielectric layers.

15. A method, comprising:
forming a stack including alternating sacrificial layers and semiconductor layers over a substrate;
replacing end portions of each sacrificial layer in the stack with a first dielectric layer;
forming a second dielectric layer to surround the stack;
forming a trench to separate the stack;
removing the sacrificial layers to form first openings;
forming a gate structure in the first openings wherein the forming of the gate structure fills the trench;
patterning the second dielectric layer to form second openings that expose the semiconductor layers;
performing a doping process to form source/drain regions in the exposed semiconductor layers; and
forming a metal contact along vertical sidewalls of the stack to contact both the first dielectric layer and the semiconductor layers, and
forming a third dielectric layer to separate the gate structure into a first portion and a second portion before patterning the second dielectric layer.

* * * * *